(12) United States Patent
Lim

(10) Patent No.: US 11,476,275 B2
(45) Date of Patent: Oct. 18, 2022

(54) NONVOLATILE MEMORY DEVICE AND METHOD OF FABRICATING THE SAME

(71) Applicant: SAMSUNG ELECTRONICS CO., LTD., Suwon-si (KR)

(72) Inventor: Geun Won Lim, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 146 days.

(21) Appl. No.: 16/998,141

(22) Filed: Aug. 20, 2020

(65) Prior Publication Data

US 2021/0280599 A1   Sep. 9, 2021

(30) Foreign Application Priority Data

Mar. 4, 2020 (KR) .................. 10-2020-0027131

(51) Int. Cl.
*H01L 27/11582* (2017.01)
*H01L 27/11565* (2017.01)
*H01L 27/11573* (2017.01)

(52) U.S. Cl.
CPC .. *H01L 27/11582* (2013.01); *H01L 27/11565* (2013.01); *H01L 27/11573* (2013.01)

(58) Field of Classification Search
CPC ............... H01L 27/11578; H01L 27/11582
See application file for complete search history.

(56) References Cited

U.S. PATENT DOCUMENTS

| | | | |
|---|---|---|---|
| 9,281,316 B2 | 3/2016 | Lee | |
| 9,331,091 B1 | 5/2016 | Cernea | |
| 9,831,266 B2 | 11/2017 | Kai et al. | |
| 9,978,766 B1 | 5/2018 | Hosoda et al. | |
| 2012/0104559 A1 | 5/2012 | Kim | |
| 2018/0026047 A1 | 1/2018 | Park et al. | |
| 2019/0198523 A1 | 6/2019 | Nakanishi et al. | |
| 2019/0348436 A1* | 11/2019 | Kim ................. | H01L 27/11573 |
| 2019/0371813 A1* | 12/2019 | Oike ..................... | H01L 23/528 |

FOREIGN PATENT DOCUMENTS

KR   10-2014-0122057 A   10/2014

* cited by examiner

*Primary Examiner* — Christopher A Johnson
(74) *Attorney, Agent, or Firm* — Lee IP Law, P.C.

(57) ABSTRACT

A nonvolatile memory device and a method of fabricating a nonvolatile memory device, the device including a substrate; a first mold structure on the substrate, the first mold structure including a plurality of first mold insulation films and a plurality of first gate electrodes, which are alternately stacked; a channel structure that penetrates the first mold structure and intersects the plurality of first gate electrodes; and at least one insulation filler that intersects the plurality of first mold insulation films and the plurality of the first gate electrodes, wherein the first mold structure is electrically separated by a word line cutting region extending in a first direction such that the first mold structure includes a first block region and a second block region, and the at least one insulation filler is in the word line cutting region and connects the first block region and the second block region.

17 Claims, 31 Drawing Sheets

NONVOLATILE MEMORY DEVICE AND METHOD OF FABRICATING THE SAME

BACKGROUND

1. Field

Embodiments relate to a nonvolatile memory device and a method of fabricating the same.

2. Description of the Related Art

A semiconductor memory device may include a volatile memory device or a nonvolatile memory device.

SUMMARY

The embodiments may be realized by providing a nonvolatile memory device including a substrate; a first mold structure on the substrate, the first mold structure including a plurality of first mold insulation films and a plurality of first gate electrodes, which are alternately stacked; a channel structure that penetrates the first mold structure and intersects the plurality of first gate electrodes; and at least one insulation filler that intersects the plurality of first mold insulation films and the plurality of the first gate electrodes, wherein: the first mold structure is electrically separated by a word line cutting region extending in a first direction such that the first mold structure includes a first block region and a second block region, and the at least one insulation filler is in the word line cutting region and connects the first block region and the second block region.

The embodiments may be realized by providing a nonvolatile memory device including a substrate; a mold structure including a first block region and a second block region spaced apart from each other, the mold structure including a plurality of gate electrodes stacked on the substrate; a plurality of channel structures penetrating the mold structure and intersecting the plurality of gate electrodes; a bit line extending in a first direction and connected to the respective channel structures; a word line trench extending in a second direction intersecting the first direction to separate the first block region and the second block region; and an insulation filler between the first block region and the second block region, the insulation filler extending in a third direction intersecting an upper surface of the substrate to connect the first block region and the second block region, wherein the first block region includes a first stack and a second stack spaced apart from each other, a block trench extending in the second direction to separate the first stack and the second stack, and a stack connection between the first stack and the second stack for connecting the first stack and the second stack.

The embodiments may be realized by providing a method of fabricating a nonvolatile memory device, the method including forming a first mold structure on a substrate, the first mold structure including a plurality of first mold insulation films and a plurality of first sacrificial patterns that are alternately stacked; forming a channel structure that penetrates the first mold structure to intersect the plurality of first sacrificial patterns; forming an insulation filler that penetrates the first mold structure to intersect the plurality of first mold insulation films and the plurality of first sacrificial patterns; and forming a word line trench in the first mold structure such that the word line trench extends in a first direction and is arranged alternately with the insulation filler along the first direction, wherein the first mold structure forms a first block region and a second block region that are electrically separated by the insulation filler and the word line trench.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
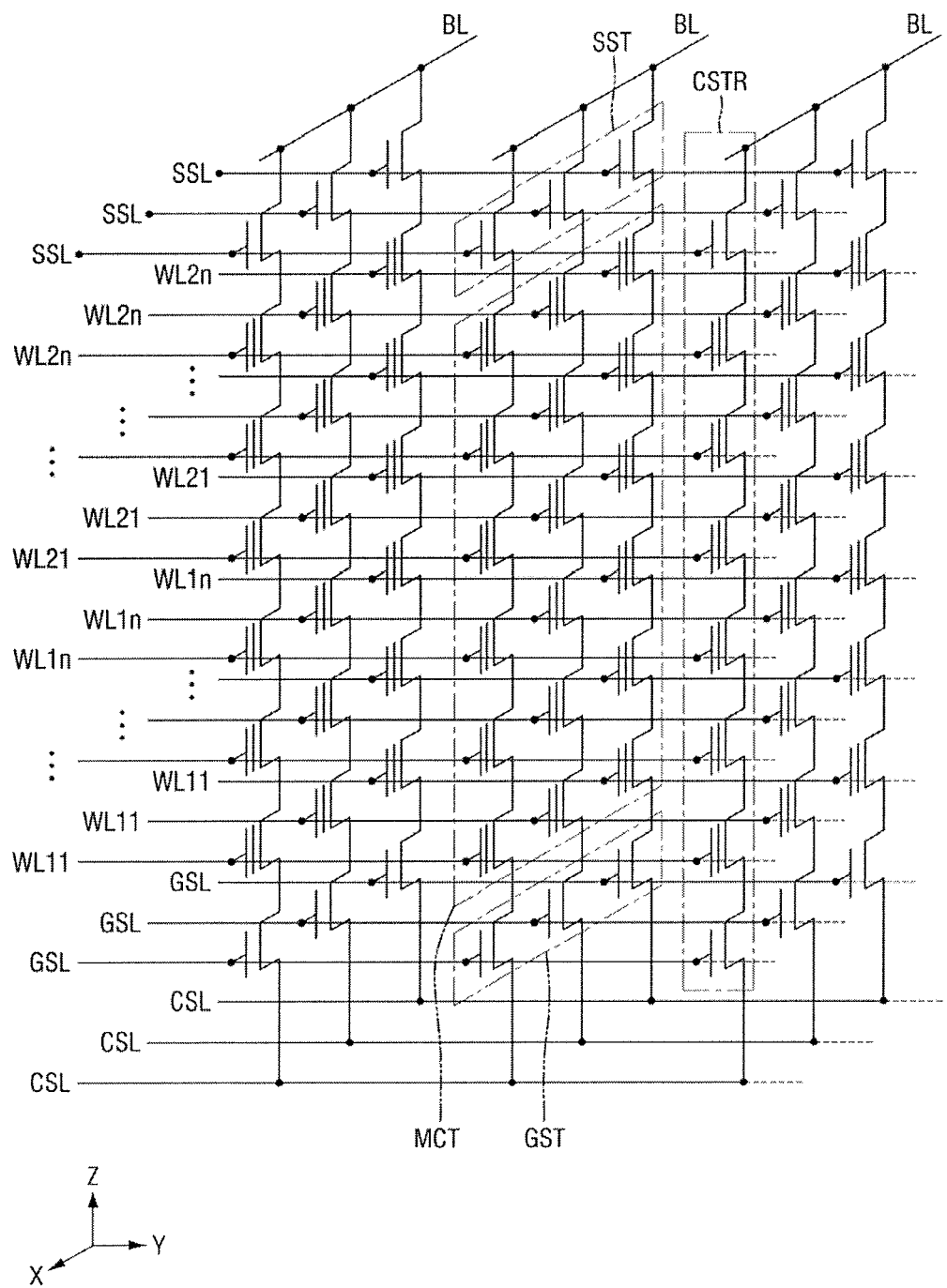
FIG. 1 is an exemplary circuit diagram of a nonvolatile memory device according to some embodiments.

FIG. 1 is an exemplary circuit diagram of the nonvolatile memory device according to some embodiments.

A memory cell array of the nonvolatile memory device according to some embodiments may include a common source line CSL, a plurality of bit lines BL, and a plurality of cell strings CSTR.

The plurality of bit lines BL may be arranged two-dimensionally. In an implementation, the bit lines BL may be spaced apart from each other and extend in a first direction X. A plurality of cell strings CSTR may be connected in parallel to each bit line BL. The cell string CSTR may be commonly connected to the common source line CSL. In an implementation, a plurality of cell strings CSTR may be between the bit lines BL and the common source line CSL.

In an implementation, the plurality of common source lines CSL may be arranged two-dimensionally. In an implementation, the common source lines CSL may be spaced apart from each other and may extend in a second direction Y that intersects the first direction X. Electrically same voltage may be applied to the common source lines CSL or different voltages may be applied to the common source lines CSL and the common source lines CSL may be separately controlled.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST, and the memory cell transistor MCT may be connected in series.

The common source line CSL may be commonly connected to sources of the ground selection transistors GST. In an implementation, the ground selection line GSL, a plurality of word lines WL11 to WL1n and WL21 to WL2n and the string selection line SSL may be disposed between the common source line CSL and the bit line BL. The ground selection line GSL may be used as the gate electrode of the ground selection transistor GST, and the word lines WL11 to WL1n and WL21 to WL2n may be used as the gate electrodes of the memory cell transistors MCT, and the string select line SSL may be used as the gate electrode of the string selection transistor SST.

Figure 2:
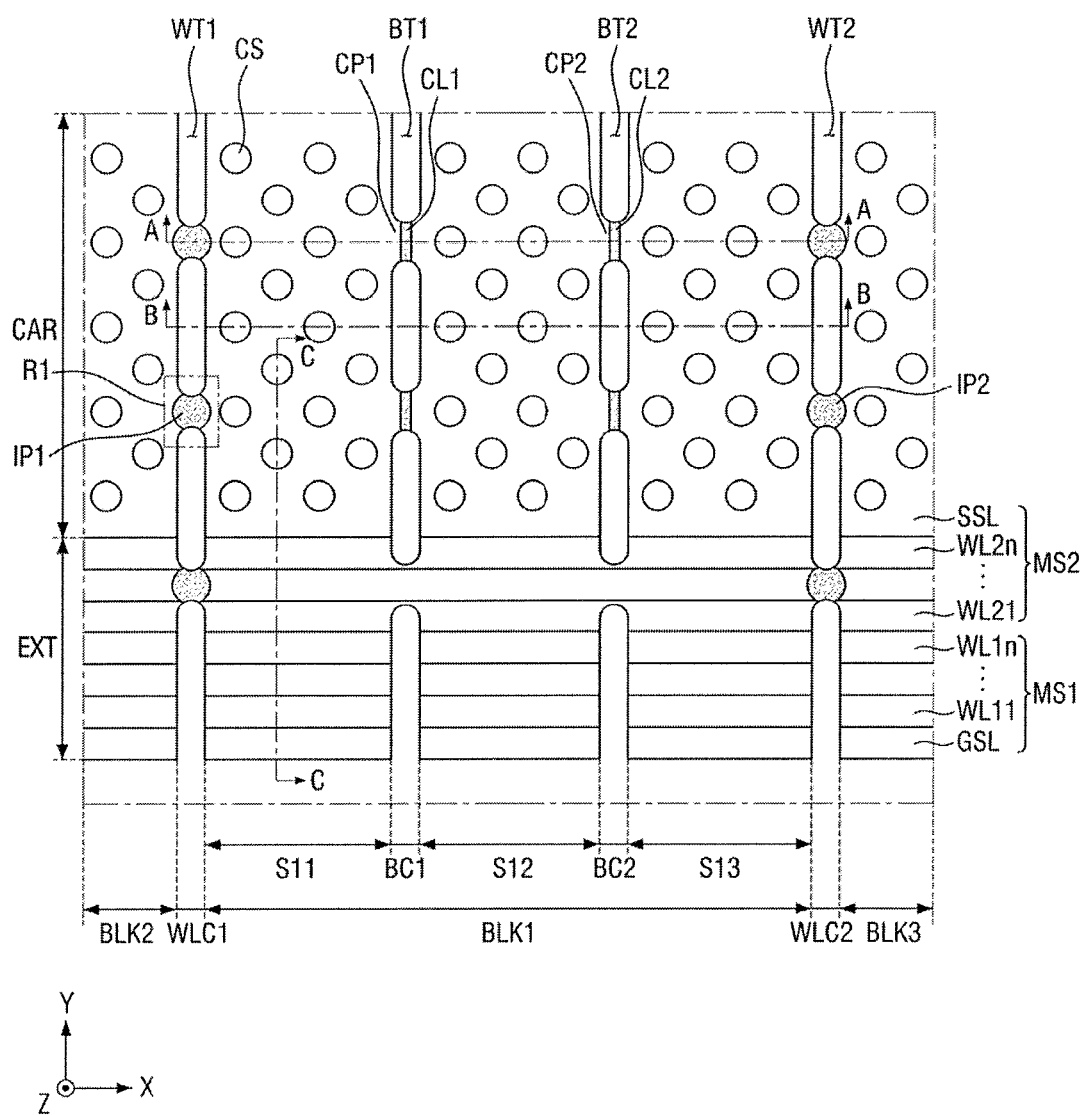
FIG. 2 is an exemplary layout diagram of the nonvolatile memory device according to some embodiments.
Figure 3:
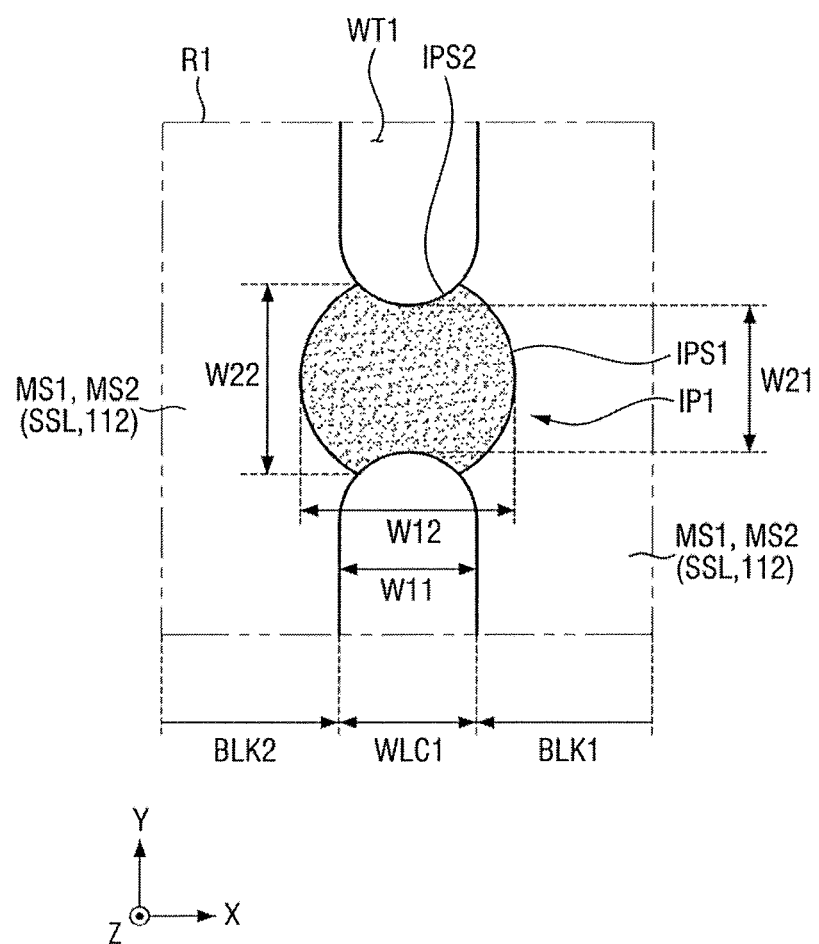
FIG. 3 is an enlarged view of a part R1 of FIG. 2.
Figure 4:
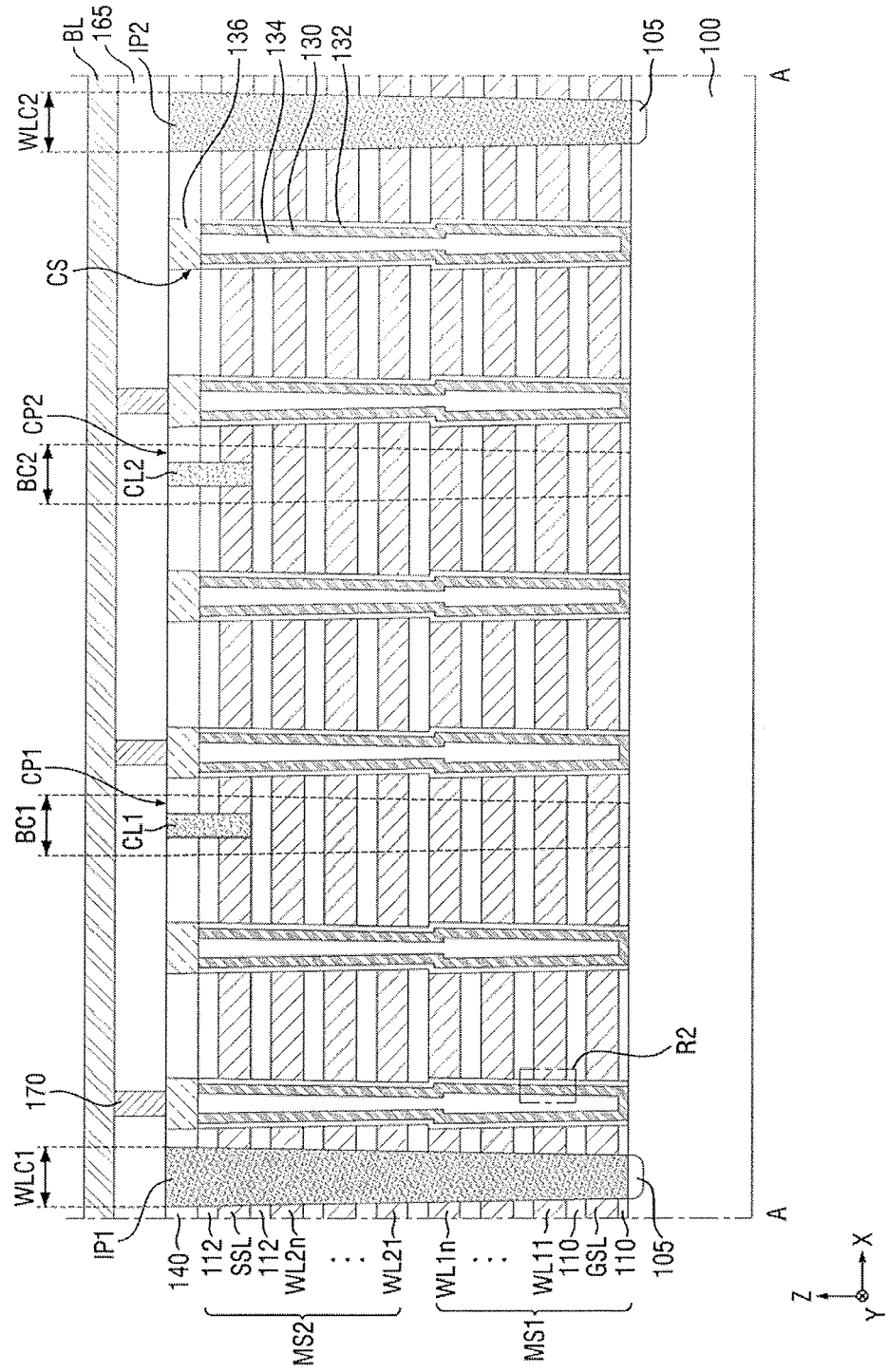
FIG. 4 is a cross-sectional view taken along lines A-A of FIG. 2.
Figure 5:
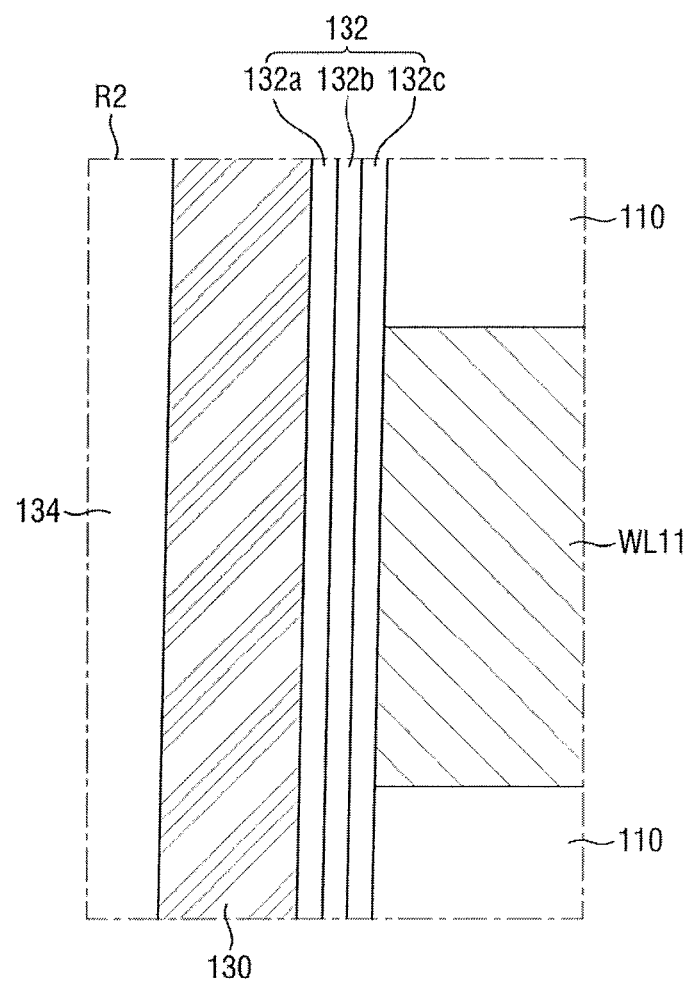
FIG. 5 is an enlarged view of a part of R2 of FIG. 4.
Figure 6:
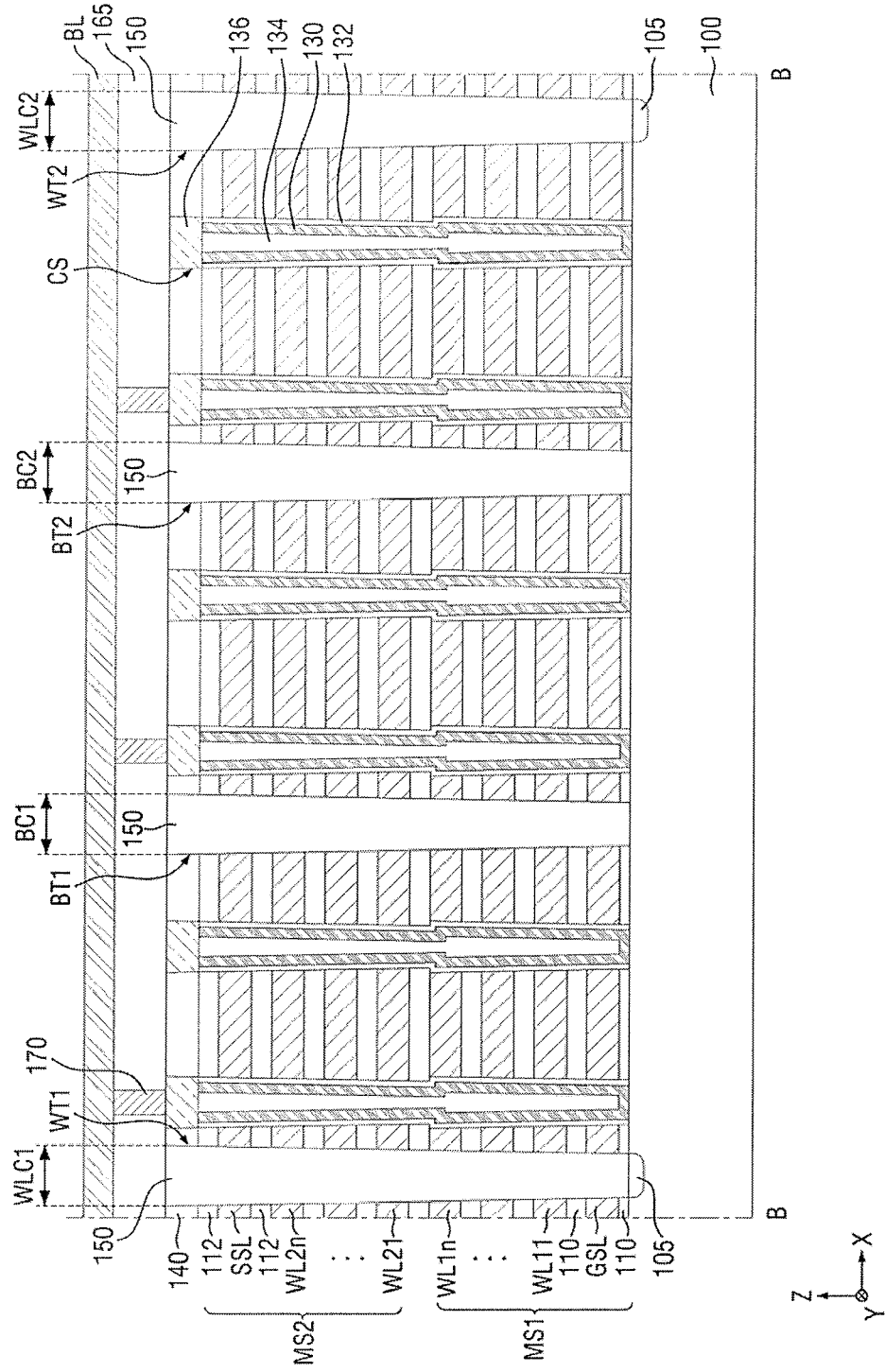
FIG. 6 is a cross-sectional view taken along lines B-B of FIG. 2.
Figure 7:
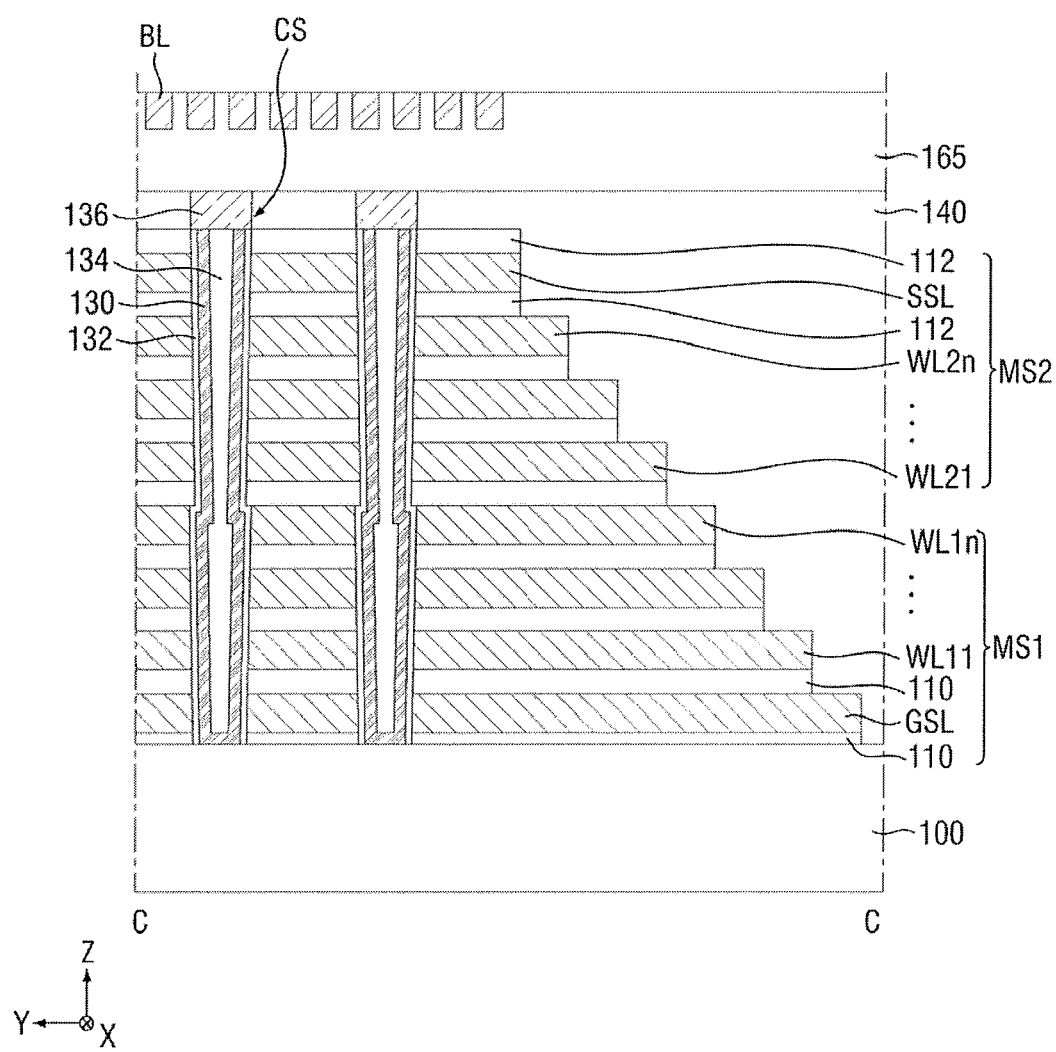
FIG. 7 is a cross-sectional view taken along lines C-C of FIG. 2.
Figure 8:
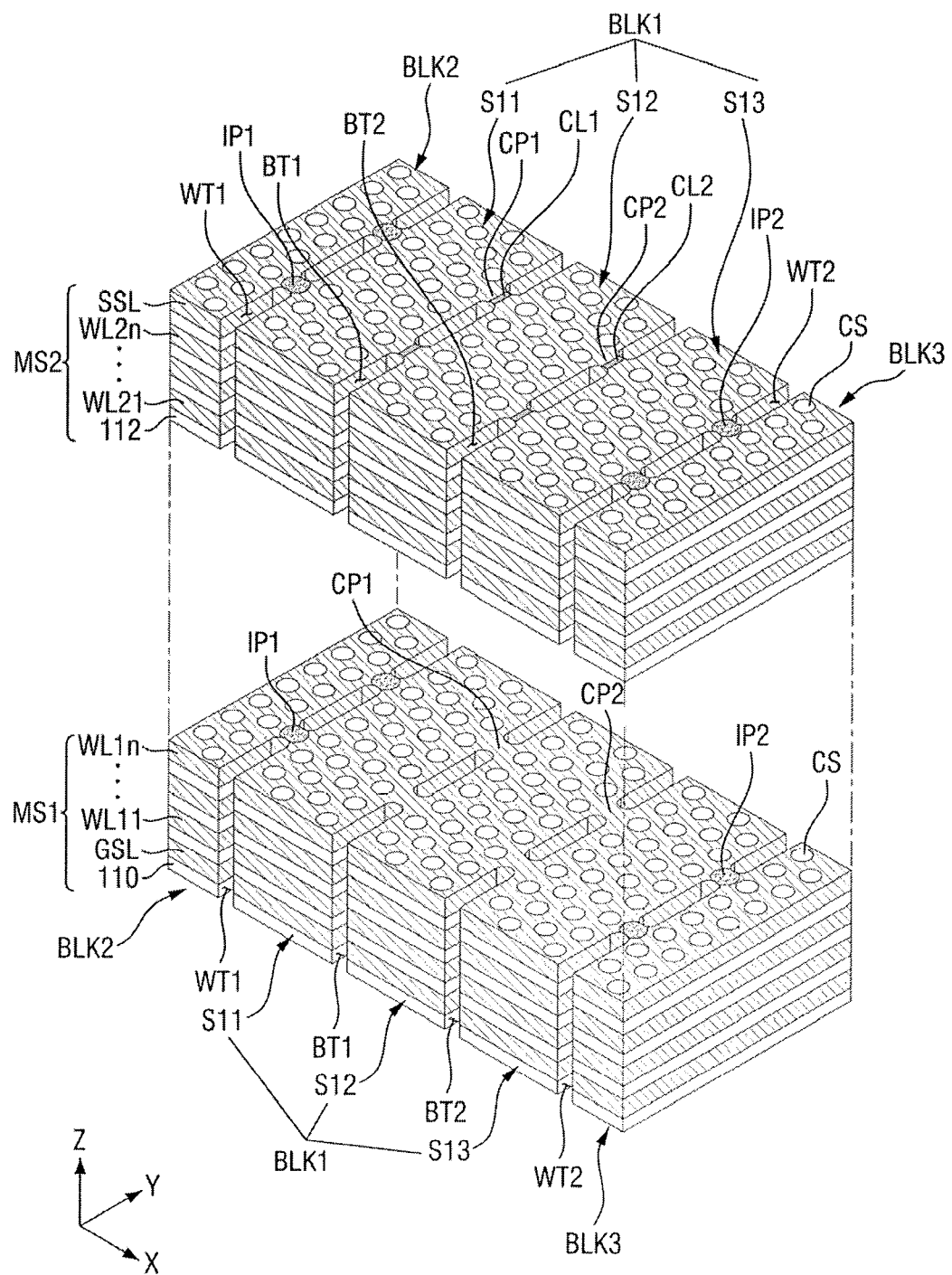
FIG. 8 is a partially exploded schematic perspective view of the nonvolatile memory device of FIGS. 2 to 7.

FIG. 2 is a layout diagram of a nonvolatile memory device according to some embodiments. FIG. 3 is an enlarged view of a part R1 of FIG. 2. FIG. 4 is a cross-sectional view taken along a line A-A of FIG. 2. FIG. 5 is an enlarged view of a part R2 of FIG. 4. FIG. 6 is a cross-sectional view taken along a line B-B of FIG. 2. FIG. 7 is a cross-sectional view taken along a line C-C of FIG. 2. FIG. 8 is a partially exploded schematic perspective view for explaining the nonvolatile memory device of FIGS. 2 to 7. For convenience of description, the bit line BL is not shown in FIGS. 2 and 8. Further, a filling insulation film 150 is not shown in FIG. 8.

Referring to FIGS. 2 to 8, the nonvolatile memory device according to some embodiments may include a substrate 100, a first mold structure MS1, a second mold structure MS2, a plurality of channel structures CS, a plurality of bit lines BL, a first insulation filler IP1, and a second insulation filler IP2.

The substrate 100 may include, e.g., a semiconductor substrate such as a silicon substrate, a germanium substrate, or a silicon-germanium substrate. In an implementation, the substrate 100 may include a silicon-on-insulator (SOI) substrate, a germanium-on-insulator (GOI) substrate, or the like. As used herein, the term "or" is not an exclusive term, e.g., "A or B" would include A, B, or A and B.

The substrate 100 may include a cell array region CAR and an extension region EXT.

A memory cell array including a plurality of memory cells may be in or on the cell array region CAR. The memory cell array may include a plurality of memory cells, a plurality of word lines and a plurality of bit lines electrically connected to each of the memory cells. In an implementation, a plurality of channel structures CS, bit lines BL and the like, which will be described below may be formed in the cell array region CAR.

The extension region EXT may be around the cell array region CAR. A plurality of gate electrodes GSL, WL11 to WL1n, WL21 to WL2n and SSL, which will be described below, may be stacked stepwise in the extension region EXT. In an implementation, memory cell contacts connected to the respective gate electrodes GSL, WL11 to WL1n, WL21 to WL2n and SSL may be formed in the extension region EXT. In an implementation, the memory cell contacts may penetrate the first interlayer insulation film 140 and the second interlayer insulation film 165 of FIG. 7 and to be connected to the respective gate electrodes GSL, WL11 to WL1n, WL21 to WL2n and SSL.

In an implementation, the substrate 100 may be provided as a plate-shaped common source line (plate CSL).

The first mold structure MS1 may be on the substrate 100. The first mold structure MS1 may include a plurality of first gate electrodes GSL and WL11 to WL1n and a plurality of first mold insulation films 110 alternately stacked on the substrate 100. In an implementation, each of the first gate electrodes GSL and WL11 to WL1n and each of the first mold insulation films 110 may be a layered structure extending in the first direction X and the second direction Y parallel to the upper surface of the substrate 100. In an implementation, the first gate electrodes GSL and WL11 to WL1n and the first mold insulation film 110 may be alternately stacked along a third direction Z intersecting (e.g., perpendicular to) the upper surface of the substrate 100.

In an implementation, the first gate electrodes GSL and WL11 to WL1n may include a ground selection line GSL and a plurality of first word lines WL11 to WL1n sequentially stacked on the substrate 100.

The second mold structure MS2 may be on the first mold structure MS1. The second mold structure MS2 may include a plurality of second gate electrodes WL21 to WL2n and SSL and a plurality of second mold insulation films 112 alternately stacked on the first mold structure MS1. In an implementation, each of the second gate electrodes WL21 to WL2n and SSL and each second mold insulation film 112 may have a layered structure extending in the first direction X and the second direction Y. In an implementation, the second gate electrodes WL21 to WL2n and SSL and the second mold insulation film 112 may be alternately stacked along the third direction Z.

In an implementation, the plurality of second gate electrodes WL21 to WL2n and SSL may include a plurality of second word lines WL21 to WL2n sequentially stacked on the first mold structure MS1.

The first gate electrodes GSL and WL11 to WL1n and the second gate electrodes WL21 to WL2n and SSL may include a conductive material. In an implementation, the first gate electrodes GSL and WL11 to WL1n and the second gate electrodes WL21 to WL2n and SSL may include, e.g., a metal such as tungsten (W), cobalt (Co) and nickel (Ni) or a semiconductor material such as silicon.

The first mold insulation film 110 and the second mold insulation film 112 may include an insulating material. In an implementation, the first mold insulation film 110 and the second mold insulation film 112 may include, e.g., silicon oxide.

The plurality of channel structures CS may penetrate the first mold structure MS1 and the second mold structure MS2, and may extend in a direction intersecting the plurality of gate electrodes GSL, WL11 to WL1n, WL21 to WL2n and SSL. In an implementation, each channel structure CS may have a pillar shape (e.g., a cylindrical shape) extending (e.g., lengthwise) in the third direction Z. Each channel structure CS may include a semiconductor pattern 130 and an information storage film 132.

The semiconductor pattern 130 may penetrate the first mold structure MS1 and the second mold structure MS2. In an implementation, the semiconductor pattern 130 may extend in the third direction Z. In an implementation, the semiconductor pattern 130 may have, e.g., a cup shape. In an implementation, the semiconductor pattern 130 may have various shapes, e.g., a cylindrical shape, a square barrel shape, or a solid filler shape.

The semiconductor pattern 130 may include, e.g., semiconductor materials such as single crystal silicon, polycrystalline silicon, organic semiconductor material, or carbon nanostructure.

The information storage film 132 may be between the semiconductor pattern 130 and the respective gate electrodes GSL, WL11 to WL1n, WL21 to WL2n and SSL. In an implementation, the information storage film 132 may extend along the side surface of the semiconductor pattern 130.

The information storage film 132 may include, e.g., silicon oxide, silicon nitride, silicon oxynitride, or a high dielectric constant material having a higher dielectric constant than silicon oxide. The high dielectric constant material may include, e.g., aluminum oxide, hafnium oxide, lanthanum oxide, tantalum oxide, titanium oxide, lanthanum hafnium oxide, lanthanum aluminum oxide, dysprosium scandium oxide, or combinations thereof.

In an implementation, the information storage film 132 may be formed of multiple films. In an implementation, as shown in FIG. 5, the information storage film 132 may include a tunnel insulation film 132a, a charge storage film 132b and a blocking insulation film 132c, which are sequentially stacked on the semiconductor pattern 130.

The tunnel insulation film 132a may include, e.g., silicon oxide or a high dielectric constant material (e.g., aluminum oxide ($Al_2O_3$) or hafnium oxide ($HfO_2$)) having a higher dielectric constant than silicon oxide. The charge storage film 132b may include, e.g., silicon nitride. The blocking insulation film 132c may include, e.g., silicon oxide or a high dielectric constant material (e.g., aluminum oxide ($Al_2O_3$) or hafnium oxide ($HfO_2$)) having a higher dielectric constant than silicon oxide.

In an implementation, each channel structure CS may further include a first filling pattern 134. The first filling pattern 134 may fill the inside of the cup-shaped semiconductor pattern 130. In an implementation, the semiconductor pattern 130 may extend along side surfaces and a bottom surface of the first filling pattern 134. The first filling pattern 134 may include, e.g., silicon oxide.

In an implementation, each channel structure CS may further include a channel pad 136. The channel pad 136 may be connected to or on an upper part of the semiconductor pattern 130. In an implementation, the channel pad 136 may be in the first interlayer insulation film 140 on the mold structure MS. The channel pad 136 may include, e.g., polysilicon doped with impurities.

In an implementation, the plurality of channel structures CS may be arranged in the zigzag form. In an implementation, as shown in FIG. 2, the plurality of channel structures CS may be arranged alternately in both the first direction X and the second direction Y. A plurality of channel structures CS arranged in the zigzag form may help further improve the degree of integration of the nonvolatile memory device.

In an implementation, a width (e.g., as measured in the first direction X) of the channel structure CS penetrating the first mold structure MS1 may decrease toward the substrate 100 (e.g., the width in the first direction X of a portion of the channel structure CS proximate to the substrate 100 may be less than the width in the first direction X of a portion of the channel structure CS distal to the substrate 100). In an implementation, a width of the channel structure CS penetrating the second mold structure MS2 may decrease toward the upper surface of the substrate 100. This may be due to the characteristics of the etching process for forming the channel structure CS.

In an implementation, a width of an uppermost part of the channel structure CS in the first mold structure MS1 may be greater than a width of a lowermost part of the channel structure CS in the second mold structure MS2. This may be because the etching process of penetrating the first mold structure MS1 and the etching process of penetrating the second mold structure MS2 are performed separately. In an implementation, the etching process of penetrating the first mold structure MS1 and the etching process of penetrating the second mold structure MS2 may, of course, be performed simultaneously.

A plurality of bit lines BL may be spaced apart from each other and extend side by side. In an implementation, each bit line BL may extend in the first direction X. In an implementation, the plurality of bit lines BL may be formed on the second mold structure MS2.

Each bit line BL may be connected to the plurality of channel structures CS. In an implementation, as shown in FIGS. 4 and 6, the bit line BL may be connected to the plurality of channel structures CS through the bit line contact 170. The bit line contact 170 may, e.g., penetrate the second interlayer insulation film 165 to electrically connect the bit line BL and the channel structure CS.

The first mold structure MS1 and the second mold structure MS2 may be electrically separated by a first word line cutting region WLC1 and a second word line cutting region WLC2 extending in the second direction Y, respectively. The first word line cutting region WLC1 and the second word line cutting region WLC2 may be spaced apart from each other and extend (e.g., lengthwise) side by side.

The first mold structure MS1 and the second mold structure MS2 separated by the first word line cutting region WLC1 and the second word line cutting region WLC2 may form a first block region BLK1, a second block region BLK2, and a third block region BLK3. In an implementation, as shown in FIG. 2, the first word line cutting region WLC1 may define or separate the first block region BLK1 and the second block region BLK2, and the second word line cutting region WLC2 may define or separate the first block region BLK1 and the third block region BLK3.

A first word line trench WT1 and a first insulation filler IP1 may be in the first word line cutting region WLC1. The first word line trench WT1 and the first insulation filler IP1 may be alternately arranged along the second direction Y to electrically separate the first block region BLK1 and the second block region BLK2. In an implementation, a plurality of first insulation fillers IP1 may be arranged along the second direction Y. In an implementation, the first word line trench WT1 and the first insulation filler IP1 may be arranged alternately over the cell array region CAR and the extension region EXT.

The first word line trench WT1 may extend in the second direction Y. The first word line trench WT1 may be between the first block region BLK1 and the second block region BLK2 to separate (physically and electrically) the first mold structure MS1 and the second mold structure MS2.

The first insulation filler IP1 may be between the first block region BLK1 and the second block region BLK2 to connect (physically) the first block region BLK1 and the second block region BLK2. The first insulation filler IP1 may include an insulating material. As a result, the first insulation filler IP1 may electrically separate (e.g., may help maintain the electrical separation between) the first block region BLK1 and the second block region BLK2. The first insulation filler IP1 may include, e.g., silicon oxide, silicon nitride, silicon oxynitride, or a low dielectric constant material having a lower dielectric constant than silicon oxide.

As shown in FIGS. 4 and 8, the first insulation filler IP1 may extend to intersect not only the plurality of gate electrodes GSL, WL11 to WL1n, WL21 to WL2n and SSL but also the plurality of first mold insulation films 110 and the plurality of second mold insulation films 112. In an implementation, the first insulation filler IP1 may have a filler shape extending in the third direction Z.

In an implementation, the width (e.g., in the first direction X) of the first insulation filler IP1 may decrease toward the substrate 100. This may be attributed to the characteristics of the etching process for forming the first insulation filler IP1.

The first insulation filler IP1 may form an interface with the first mold structure MS1 (or the second mold structure MS2) from a planar viewpoint (e.g., in plan view or when viewed along the third direction Z). For example, as shown in FIG. 3, the first insulation filler IP1 may have a first side surface IPS1 that forms an interface with the first mold structure MS1 (or the second mold structure MS2).

The first side surface IPS1 of the first insulation filler IP1 may form an interface not only with the plurality of gate electrodes GSL, WL11 to WL1n, WL21 to WL2n and SSL, but also the plurality of first mold insulation films 110 and the plurality of second mold insulation films 112. In an implementation, the first side surface IPS1 of the first insulation filler IP1 may form an interface with the string selection line SSL and the second mold insulation film 112.

In an implementation, the first insulation filler IP1 may include an insulating material different from the first mold insulation film 110 (or the second mold insulation film 112). In an implementation, the first mold insulation film 110 may include a first oxide, and the first insulation filler IP1 may include a second oxide that is different from the first oxide. In an implementation, the first insulation filler IP1 may form an interface with the first mold insulation film 110.

In an implementation, the first side surface IPS1 of the first insulation filler IP1 may be convex toward (e.g., protruding in the first direction X into) the first mold structure MS1 (or second mold structure MS2). This may be attributed to the characteristics of the etching process for forming the first insulation filler IP1.

In an implementation, a width W12 of the first insulation filler IP1 in the first direction X may be greater than a width W11 of the first word line trench WT1. In an implementation, the width W12 of the first insulation filler IP1 in the first direction X may be equal to or smaller than the width W11 of the first word line trench WT1.

The first insulation filler IP1 may form an interface with the first word line trench WT1 in a plan view. For example, as shown in FIG. 3, the first insulation filler IP1 may include a second side surface IPS2 that forms an interface with the first word line trench WT1. In an implementation, the first word line trench WT1 may expose the second side surface IPS2 of the first insulation filler IP1.

In an implementation, the second side surface IPS2 of the first insulation filler IP1 may be concave toward (e.g., may have a concave opening that faces) the first word line trench WT1. This may be due to the characteristics of the etching process for forming the first word line trench WT1.

In an implementation, a maximum width W22 of the first insulation filler IP1 in the second direction Y may be greater than a shortest distance W21 between the adjacent first word line trenches WT1. In an implementation, at least a part of the first insulation filler IP1 may overlap at least a part of the first word line trench WT1 in the first direction X.

A second word line trench WT2 and a second insulation filler IP2 may be formed in the second word line cutting region WLC2. The second word line trench WT2 and the second insulation filler IP2 may be alternately arranged along the second direction Y to (electrically) separate the first block region BLK1 and the third block region BLK3. In an implementation, a plurality of second insulation fillers IP2 may be arranged (e.g., spaced apart) along the second direction Y. In an implementation, the second word line trench WT2 and the second insulation filler IP2 may be arranged alternately over the cell array region CAR and the extension region EXT.

The second word line trench WT2 may be similar to the aforementioned first word line trench WT1, and the second insulation filler IP2 may be similar to the aforementioned first insulation filler IP1, and a repeated detailed description thereof may be omitted.

In an implementation, as illustrated in FIGS. 2 and 8, the first insulation filler IP1 and the second insulation filler IP2 may be arranged in a line (e.g., aligned) along the first direction X. In an implementation, the first insulation filler IP1 and the second insulation filler IP2 may be arranged alternately (e.g., not aligned) in the first direction X.

In an implementation, an impurity region 105 may be in the substrate 100 below the first insulation filler IP1 and the second insulation filler IP2. The impurity region 105 may extend in the second direction Y and may be provided as a common source line (e.g., CSL of FIG. 1) of the nonvolatile memory device according to some embodiments.

In an implementation, the first block region BLK1 may be separated by the first block cutting region BC1 and the second block cutting region BC2, each extending in the second direction Y. The first block cutting region BC1 and the second block cutting region BC2 may be spaced apart from each other (e.g., in the first direction X) and extend side by side (e.g., in the second direction Y). In an implementation, as illustrated in the drawings, the first block region BLK1 may be only separated by two block cutting regions BC1 and BC2. In an implementation, three or more block cutting region may separate the first block region BLK1.

The first block region BLK1 separated by the first block cutting region BC1 and the second block cutting region BC2 may form first to third stacks S11, S12, and S13. In an implementation, as shown in FIG. 2, the first block cutting region BC1 may define a first stack S11 and a second stack S12 spaced apart from each other, and the second block cutting region BC2 may define a second stack S12 and a third stack S13 spaced apart from each other.

A first block trench BT1 and a first stack connection CP1 may be formed in the first block cutting region BC1. The first block trench BT1 and the first stack connection CP1 may be arranged alternately along the second direction Y to separate the first stack S11 and the second stack S12. In an implementation, the plurality of first stack connections CP1 may be arranged along the second direction Y. In an implementation, the first block trench BT1 and the first stack connection CP1 may be arranged alternately over the cell array region CAR and the extension region EXT.

The first block trench BT1 may extend in the second direction Y. The first block trench BT1 may be between the first stack S11 and the second stack S12 to (physically and electrically) separate the first stack S11 and the second stack S12.

The first stack connection CP1 may be between the first stack S11 and the second stack S12 to (physically) connect the first stack S11 and the second stack S12. The first stack S11, the second stack S12, and the first stack connection CP1 may integrally form the first mold structure MS1 and the second mold structure MS2. In an implementation, the first stack S11, the second stack S12, and the first stack connection CP1 may include a plurality of first gate electrodes GSL and WL11 to WL1n, a plurality of first mold insulation films 110, a plurality of second gate electrodes WL21 to WL2n and SSL and a plurality of second mold insulation films 112, respectively.

In an implementation, the first insulation filler IP1 and the first stack connection CP1 may be arranged in a line (e.g., aligned) along the first direction X. In an implementation, the first insulation filler IP1 and the first stack connection CP1 may be arranged to overlap in the first direction X.

A second block trench BT2 and a second stack connection CP2 may be in the second block cutting region BC2. The second block trench BT2 and the second stack connection CP2 may be arranged alternately along the second direction Y to space the second stack S12 and the third stack S13 apart from each other. In an implementation, a plurality of second stack connections CP2 may be arranged along the second direction Y. In an implementation, the second block trench BT2 and the second stack connection CP2 may be arranged alternately over the cell array region CAR and the extension region EXT.

The second block trench BT2 may be similar to the aforementioned first block trench BT1, and the second stack connection CP2 may be similar to the aforementioned first stack connection CP1, and a repeated detailed description thereof may be omitted.

In an implementation, as illustrated in FIGS. 2 and 8, the first stack connection CP1 and the second stack connection CP2 may be arranged in a line along the first direction X. In an implementation, the first stack connection CP1 and the second stack connection CP2 may be arranged alternately (e.g., not aligned) in the first direction X.

In an implementation, a first cutting line CL1 and a second cutting line CL2 may be in the second mold structure MS2. The first cutting line CL1 and the second cutting line CL2 may cut the string selection line SSL. In an implementation, as shown in FIGS. 4 and 8, each of the first cutting line CL1 and the second cutting line CL2 may extend in the second direction Y to cut the string selection line. The first cutting line CL1 and the second cutting line CL2 may be spaced apart from each other and extend side by side.

In an implementation, the first cutting line CL1 may be inside the first stack connection CP1, and the second cutting line CL2 may be inside the second stack connection CP2. As a result, the channel structure CS in the first stack S11 and the channel structure CS in the second stack S12 may be separately selected and controlled through the string selection line SSL that is cut by the first cutting line CL1. Similarly, the channel structure CS in the second stack S12 and the channel structure CS in the third stack S13 may be separately selected and controlled through the string selection line SSL that is cut by the second cutting line CL2.

In an implementation, the first cutting line CL1 and the second cutting line CL2 may be only formed in the first stack connection CP1 and the second stack connection CP2. In an implementation, the first cutting line CL1 and the second cutting line CL2 may be formed in the first to third stacks S11, S12 and S13 to cut the string selection line SSL.

In an implementation, a filling insulation film 150 may be in the first mold structure MS1 and the second mold structure MS2. As shown in FIG. 6, the filling insulation film 150 may fill the first word line trench WT1, the second word line trench WT2, the first block trench BT1, and the second block trench BT2.

The filling insulation film 150 may include, e.g., silicon oxide, silicon nitride, silicon oxynitride, or a low dielectric constant material having a lower dielectric constant than silicon oxide.

In an implementation, the filling insulation film 150 may include insulating materials different from the first insulation filler IP1 and the second insulation filler IP2. In an implementation, the first insulation filler IP1 and the second insulation filler IP2 may include a second oxide, and the filling insulation film 150 may include a third oxide different from the second oxide. Therefore, the first insulation filler IP1 and the second insulation filler IP2 may form an interface with the filling insulation film 150.

As a nonvolatile memory device becomes more highly integrated, more and more channel structures may be placed in the block region (e.g., the aforementioned first block region BLK1) electrically cut by the word line trench. Further, in order to individually control a large number of channel structures in the block region, the block region may be cut again by the block trench to form a plurality of stacks (e.g., the aforementioned first to third stacks S11, S12 and S13).

As an aspect ratio AR of the nonvolatile memory device increases, a leaning phenomenon (such as a breakage of each stack or a leaning in one direction) could occur. In order to prevent this phenomenon, stack connections (e.g., the aforementioned first and second stack connections CP1 and CP2) that support between the stacks by patterning the block region in an "H" shape may be formed.

Stack connections could cause a distribution failure between the block cutting region in which the stack connections are formed (e.g., the aforementioned first and second block cutting regions BC1 and BC2) and the word line cutting regions in which the connections are not formed (e.g., the aforementioned first and second word line cutting regions WLC1 and WLC2), and the reliability of the product could be reduced. In the process of patterning a block region into an "H" shape, an etchant may not be evenly injected into the block trench and the word line trench due to the presence of the stack connections.

In contrast, in the nonvolatile memory device according to some embodiments, the first and second insulation fillers IP1 and IP2 may be formed in the first and the second word line cutting regions WLC1 and WLC2. The first and second insulation fillers IP1 and IP2 may have the same shape as the first and second stack connections CP1 and CP2 and may be between the first to third block regions BLK1, BLK2 and BLK3, and it is possible to help prevent a distribution failure between the first and second block cutting regions BC1 and BC2 and the first and second word line cutting regions WLC1 and WLC2. In addition, the first and second insulation fillers IP1 and IP2 may help support the first to third block regions BLK1, BLK2 and BLK3, and it is possible to help prevent the leaning phenomenon of the first to third block regions BLK1, BLK2 and BLK3. Accordingly, it is possible to provide a nonvolatile memory device having improved product reliability.

Figure 9:
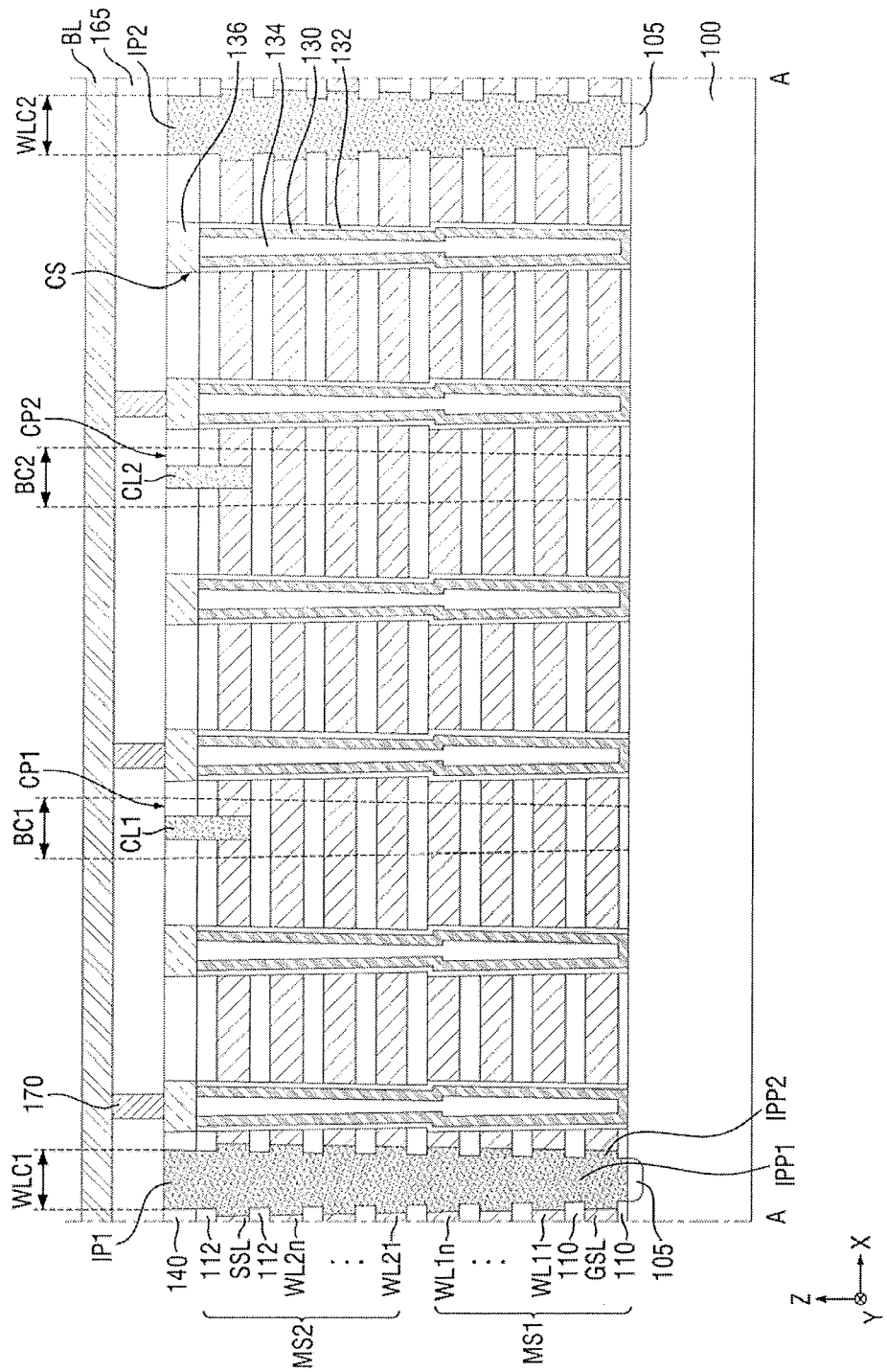
FIG. 9 is a cross-sectional view of the nonvolatile memory device according to some embodiments.

FIG. 9 is a cross-sectional view of a nonvolatile memory device according to some embodiments. For the sake of convenience of description, repeated parts of contents explained above using FIGS. 1 to 8 may be briefly explained or omitted.

Referring to FIG. 9, in the nonvolatile memory device according to some embodiments, a side surface of the first insulation filler IP1 and a side surface of the second insulation filler IP2 may have unevenness (e.g., may not be flat).

In an implementation, the first insulation filler IP1 may include a filler part IPP1 and a plurality of protrusions IPP2. The filler part IPP1 may extend in the third direction Z and may penetrate the first mold structure MS1 and the second mold structure MS2. The plurality of protrusions IPP2 may protrude from the side surface of the filler IPP1. This may be attributed to the characteristics of the etching process for forming the first insulation filler IP1.

In an implementation, the protrusion IPP2 may protrude toward the respective gate electrode GSL, WL11 to WL1n, WL21 to WL2n and SSL. In such a case, the width of the portion of the first insulation filler IP1 that electrically separates the respective gate electrodes GSL, WL11 to WL1n, WL21 to WL2n and SSL may become wider, and a nonvolatile memory device having improved product reliability can be provided.

Figure 10:
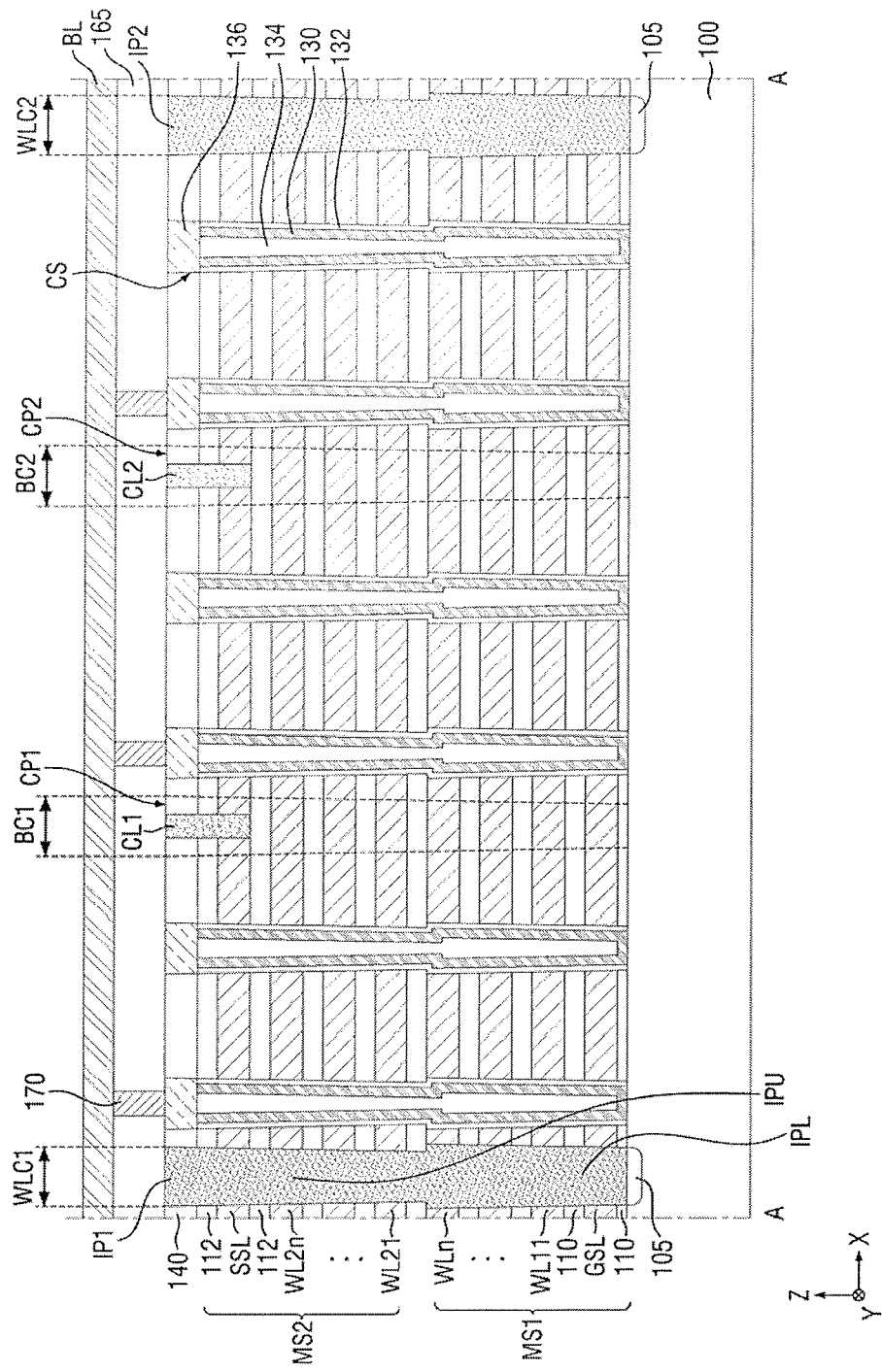
FIG. 10 is a cross-sectional view of the nonvolatile memory device according to some embodiments.

FIG. 10 is a cross-sectional view of a nonvolatile memory device according to some embodiments. For the sake of convenience of description, repeated parts of contents explained above using FIGS. 1 to 8 may be briefly explained or omitted.

Referring to FIG. 10, in the nonvolatile memory device according to some embodiments, a width (e.g., in the first direction X) of uppermost parts (e.g., distal to the substrate 100 in the third direction Z) of the first and second insulation fillers IP1 and IP2 of the first mold structure MS1 may be greater than a width of lowermost parts (e.g., proximate to the substrate 100 in the third direction Z) of the first and second insulation fillers IP1 and IP2 in the mold structure MS2.

In an implementation, the first insulation filler IP1 may include a lower filler IPL and an upper filler IPU over the lower filler IPL. The lower filler IPL may extend in the third direction Z and may penetrate the first mold structure MS1, and the upper filler IPU may extend in the third direction Z and may penetrate the second mold structures MS2. In an implementation, the width of the uppermost part of the lower filler IPL may be greater than the width of the lowermost part of the upper filler IPU. This may be because the etching process of penetrating the first mold structure MS1 and the etching process of penetrating the second mold structure MS2 are performed separately.

Figure 11:
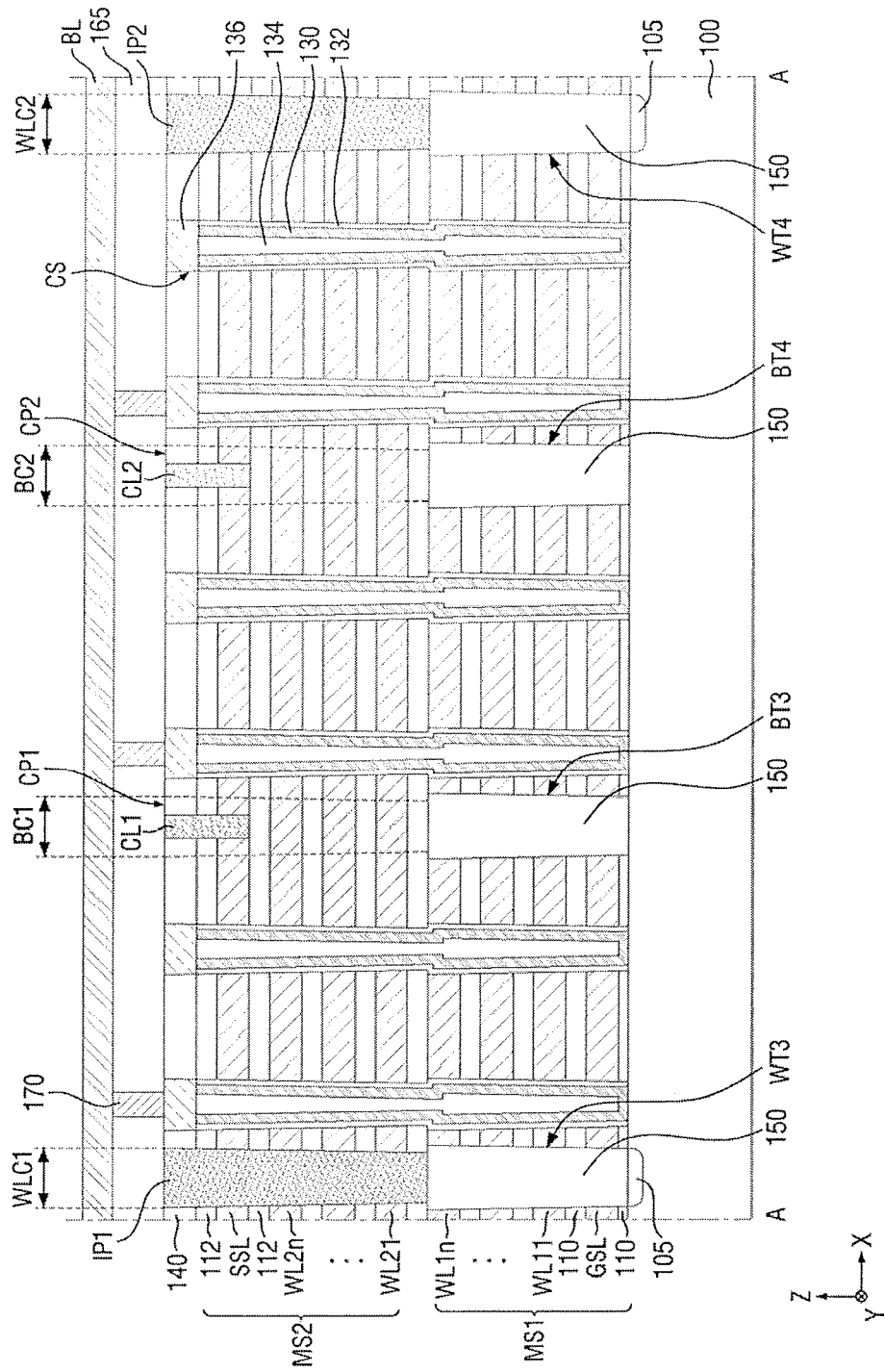
FIG. 11 is a cross-sectional view of the nonvolatile memory device according to some embodiments.
Figure 12:
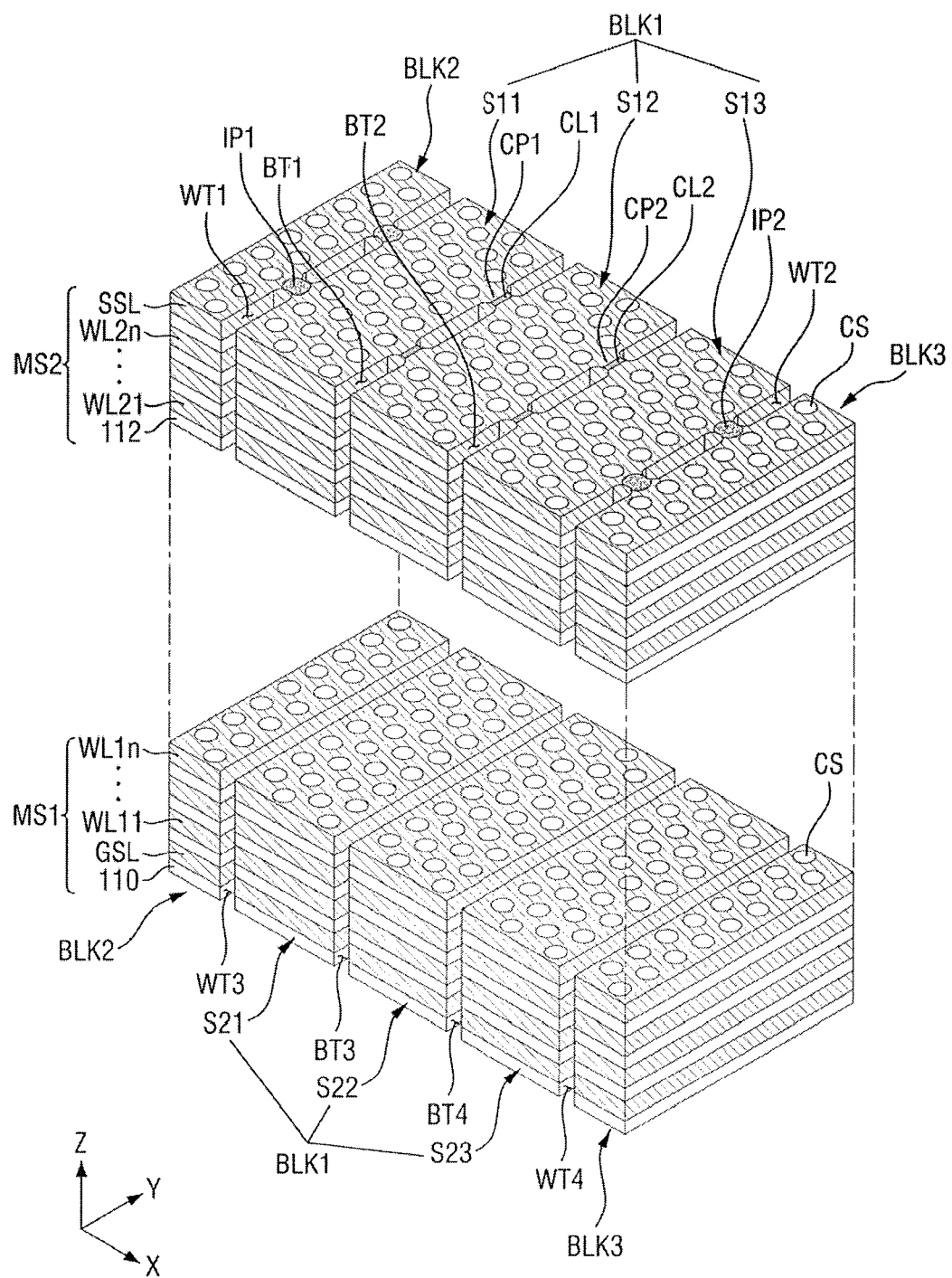
FIG. 12 is a partially exploded schematic perspective view of the nonvolatile memory device of FIG. 11.

FIG. 11 is a cross-sectional view of a nonvolatile memory device according to some embodiments. FIG. 12 is a partially exploded schematic perspective view of the nonvolatile memory device of FIG. 11. For the sake of convenience of description, repeated parts of contents explained above using FIGS. 1 to 8 may be briefly explained or omitted.

Referring to FIGS. 11 and 12, in the nonvolatile memory device according to some embodiments, the first and second insulation fillers IP1 and IP2 may not intersect or penetrate the first mold structure MS1.

In an implementation, the first insulation filler IP1 may connect the first block region BLK1 of the second mold structure MS2 and the second block region BLK2 of the second mold structure MS2, and may not connect the first block region BLK1 of the first mold structure MS1 and the second block region BLK2 of the first mold structure MS1.

In an implementation, a third word line trench WT3 that extends in the second direction Y and separates the first block region BLK1 of the first mold structure MS1 and the second block region BLK2 of the first mold structure MS1 may be formed. In an implementation, a fourth word line trench WT4 which extends in the second direction Y and separates the first block region BLK1 of the first mold structure MS1 and the third block region BLK3 of the first mold structure MS1 may be formed.

In an implementation, the third word line trench WT3 and the fourth word line trench WT4 may extend (e.g., lengthwise) in the second direction Y and completely cut the first mold structure MS1. As shown in FIG. 11, the filling insulation film 150 may fill the third word line trench WT3 and the fourth word line trench WT4. In such a case, the first insulation filler IP1 and the second insulation filler IP2 may be on the upper surface of the filling insulation film 150.

In an implementation, the first block region BLK1 of the first mold structure MS1 may be separated by a third block trench BT3 and a fourth block trench BT4 extending in the second direction Y, respectively. The third block trench BT3 and the fourth block trench BT4 may be spaced apart from each other and extend side by side.

The first block region BLK1 of the first mold structure MS1 separated by the third block trench BT3 and the fourth block trench BT4 may form fourth to sixth stacks S21, S22, and S23. In an implementation, as shown in FIG. 12, the third block trench BT3 may define a fourth stack S21 and a fifth stack S22 spaced apart from each other, and the fourth block trench BT4 may define a fifth stack S22 and a sixth stack S23 spaced apart from each other.

In an implementation, the third block trench BT3 and the fourth block trench BT4 may extend lengthwise in the second direction Y, and may completely cut the first block region BLK1 of the first mold structure MS1. As shown in FIG. 11, the filling insulation film 150 may fill the third block trench BT3 and the fourth block trench BT4. In such a case, the first stack connection CP1 and the second stack connection CP2 in the second mold structure MS2 may be formed on the upper surface of the filling insulation film 150.

Figure 13:
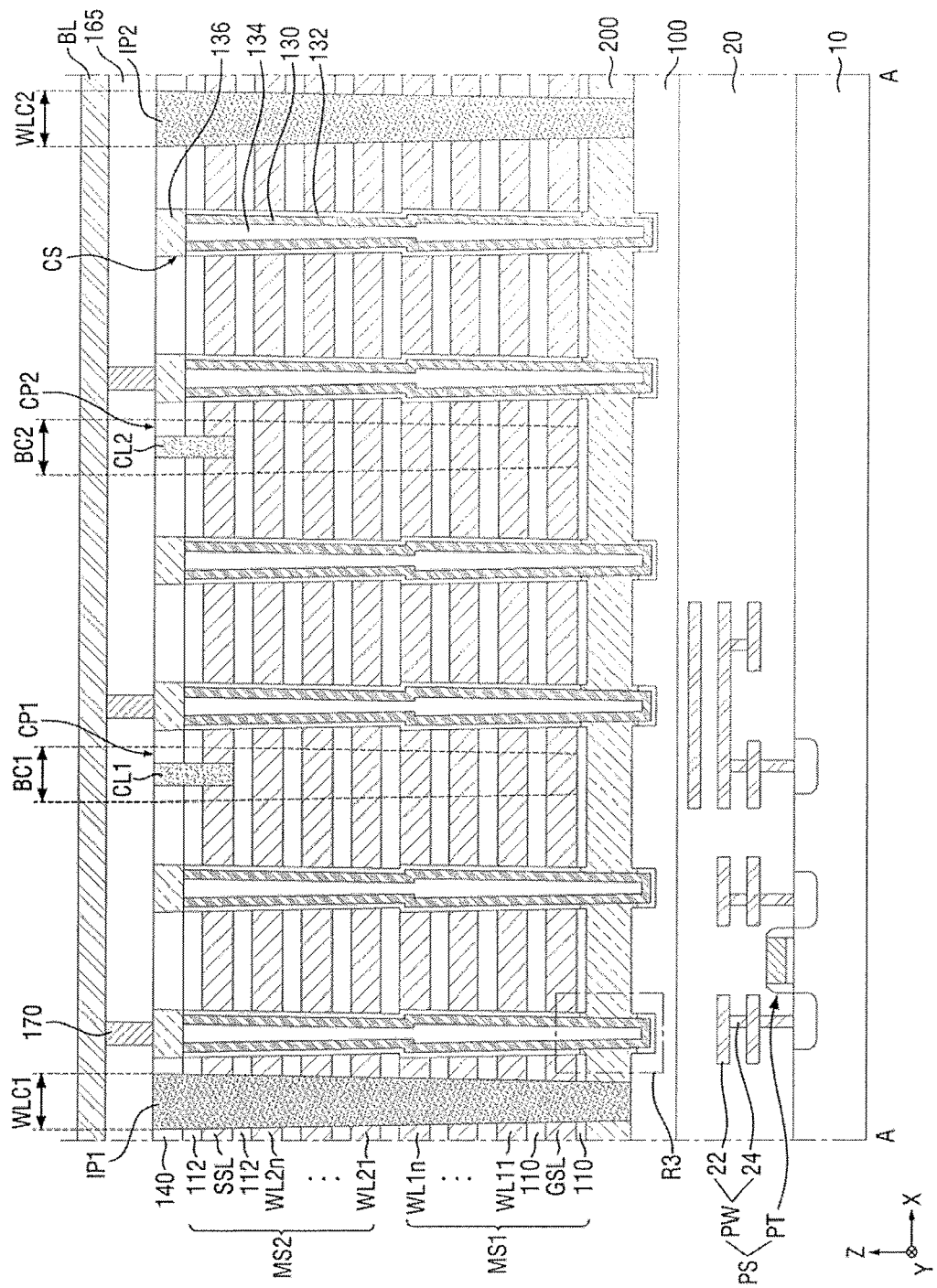
FIG. 13 is a cross-sectional view of the nonvolatile memory device according to some embodiments.
Figure 14:
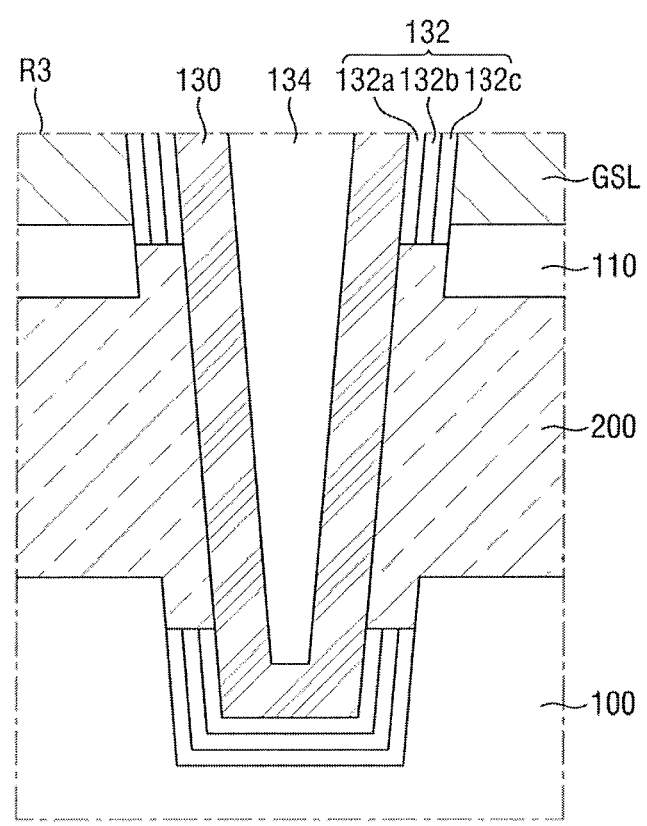
FIG. 14 is an enlarged view of a part of R3 of FIG. 13.

FIG. 13 is a cross-sectional view of the nonvolatile memory device according to some embodiments. FIG. 14 is an enlarged view of a part R3 of FIG. 13. For the sake of convenience of description, repeated parts of contents explained above using FIGS. 1 to 8 may be briefly explained or omitted.

Referring to FIGS. 13 and 14, the nonvolatile memory device according to some embodiments may further include a base substrate 10, a peripheral circuit structure PS, and a source structure 200.

The peripheral circuit structure PS may be on the base substrate 10. The peripheral circuit structure PS may form a peripheral circuit that controls the operation of each memory cell. In an implementation, the peripheral circuit structure PS may include a row decoder, a column decoder, a page buffer, a control circuit, or the like. In an implementation, the peripheral circuit structure PS may include a peripheral circuit element PT and a wiring structure PW. In an implementation, the peripheral circuit element PT may include a transistor.

In an implementation, the peripheral circuit element PT may be a high-voltage transistor. In an implementation, the peripheral circuit element PT may be only a transistor. In an implementation, the peripheral circuit element PT may include various passive elements, e.g., a capacitor, a resistor, or an inductor, as well as various active elements, e.g., a transistor.

In an implementation, a third interlayer insulation film 20 may be on the base substrate 10. The third interlayer insulation film 20 may cover the peripheral circuit element PT on the base substrate 10.

The wiring structure PW may include peripheral circuit wirings 22 and peripheral circuit contacts 24. The peripheral circuit wirings 22 and the peripheral circuit contacts 24 may be, e.g., inside the third interlayer insulation film 20. The peripheral circuit wirings 22 may be connected to the peripheral circuit element PT through the peripheral circuit contacts 24.

In an implementation, the substrate 100 may be on the third interlayer insulation film 20 including the peripheral circuit structure PS.

The source structure 200 may be on the substrate 100. In an implementation, the source structure 200 may be between the substrate 100 and the first mold structure MS1. The source structure 200 may include a conductive material. In an implementation, the source structure 200 may include polysilicon doped with impurities or metal.

In an implementation, the channel structure CS may penetrate the source structure 200 and be connected to the substrate 100. In an implementation, a lower part of the channel structure CS may be embedded in an upper part of the substrate 100.

In an implementation, the source structure 200 may be connected to the semiconductor pattern 130 of the channel structure CS. In an implementation, the source structure 200 may penetrate the information storage film 132 and may be connected to the semiconductor pattern 130.

In an implementation, a part of the source structure 200 adjacent to the semiconductor pattern 130 may have a form that protrudes toward the information storage film 132. In an implementation, in the region adjacent to the semiconductor pattern 130, a length of the source structure 200 extending in the third direction Z may become further longer. This may be due to the characteristics of the etching process of removing a part of the information storage film 132 to form the source structure 200.

Figure 15:
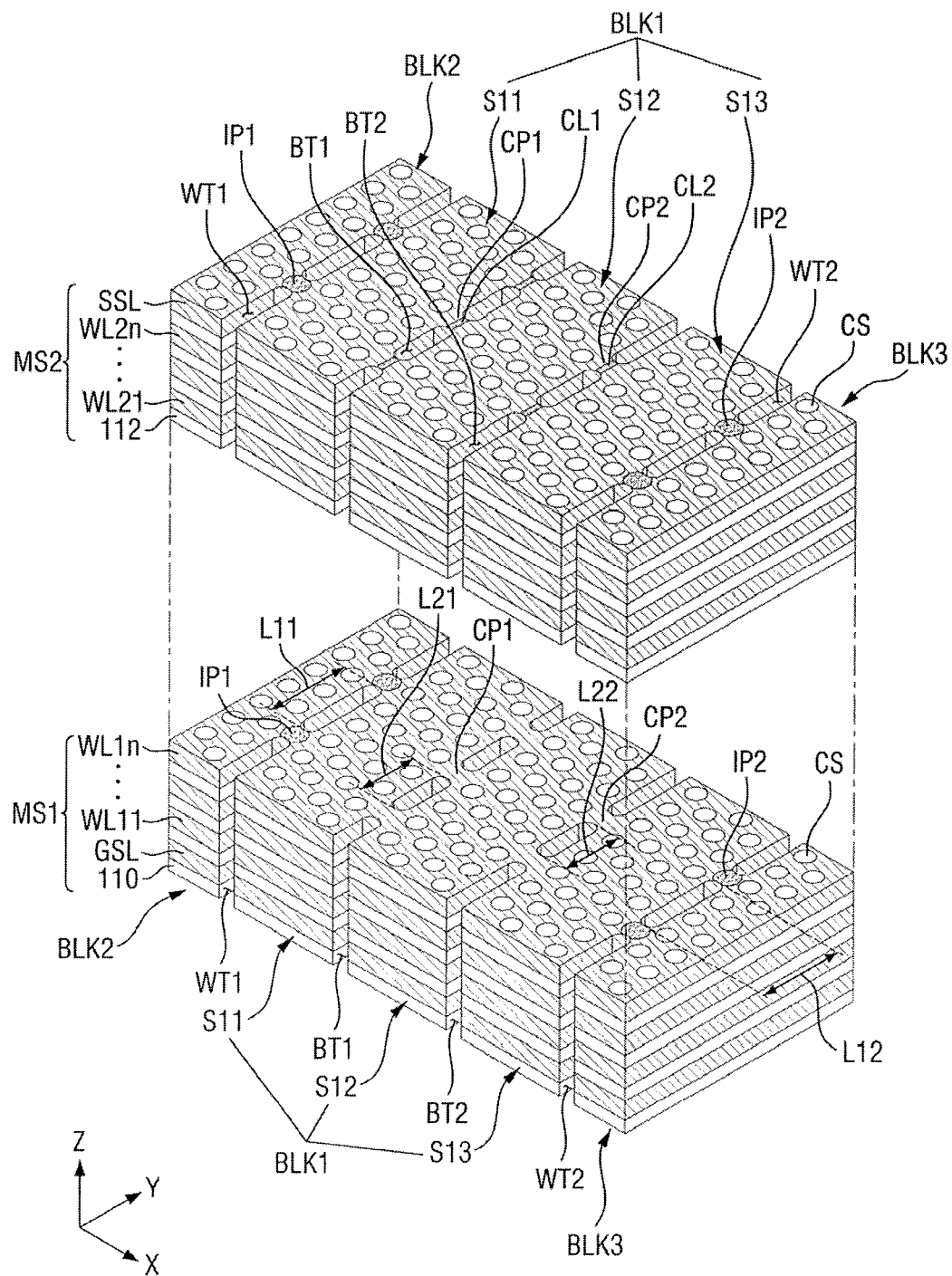
FIG. 15 is a partially exploded schematic perspective view of the nonvolatile memory device according to some embodiments.

FIG. 15 is a partially exploded schematic perspective view of a nonvolatile memory device according to some embodiments. For the sake of convenience of description, repeated parts of contents explained above using FIGS. 1 to 8 may be briefly explained or omitted.

Referring to FIG. 15, in the nonvolatile memory device according to some embodiments, the first stack connection CP1 and the second stack connection CP2 may be arranged in a zigzag form.

In an implementation, the first stack connection CP1 and the second stack connection CP2 may be arranged alternately (e.g., not aligned) in the first direction X.

In an implementation, the first insulation filler IP1 and the first stack connection CP1 may be arranged in the zigzag form. In an implementation, the first insulation filler IP1 and the first stack connection CP1 may be arranged alternately (e.g., not aligned) in the first direction X.

In an implementation, a first length L11 of the first word line trench WT1 in the second direction Y may be different from a second length L21 of the first block trench BT1 in the second direction Y. In an implementation, the first length L11 may be longer than the second length L21, or the first length L11 may be smaller than the second length L21.

In an implementation, the first length L11 may be the same as a third length L12 of the second word line trench WT2 in the second direction Y, or the first length L11 and the third length L12 may be different from each other. In an implementation, the second length L21 may be the same as a fourth length L22 of the second block trench BT2 in the second direction Y, or the second length L21 and the fourth length L22 may be different from each other.

Figure 16:
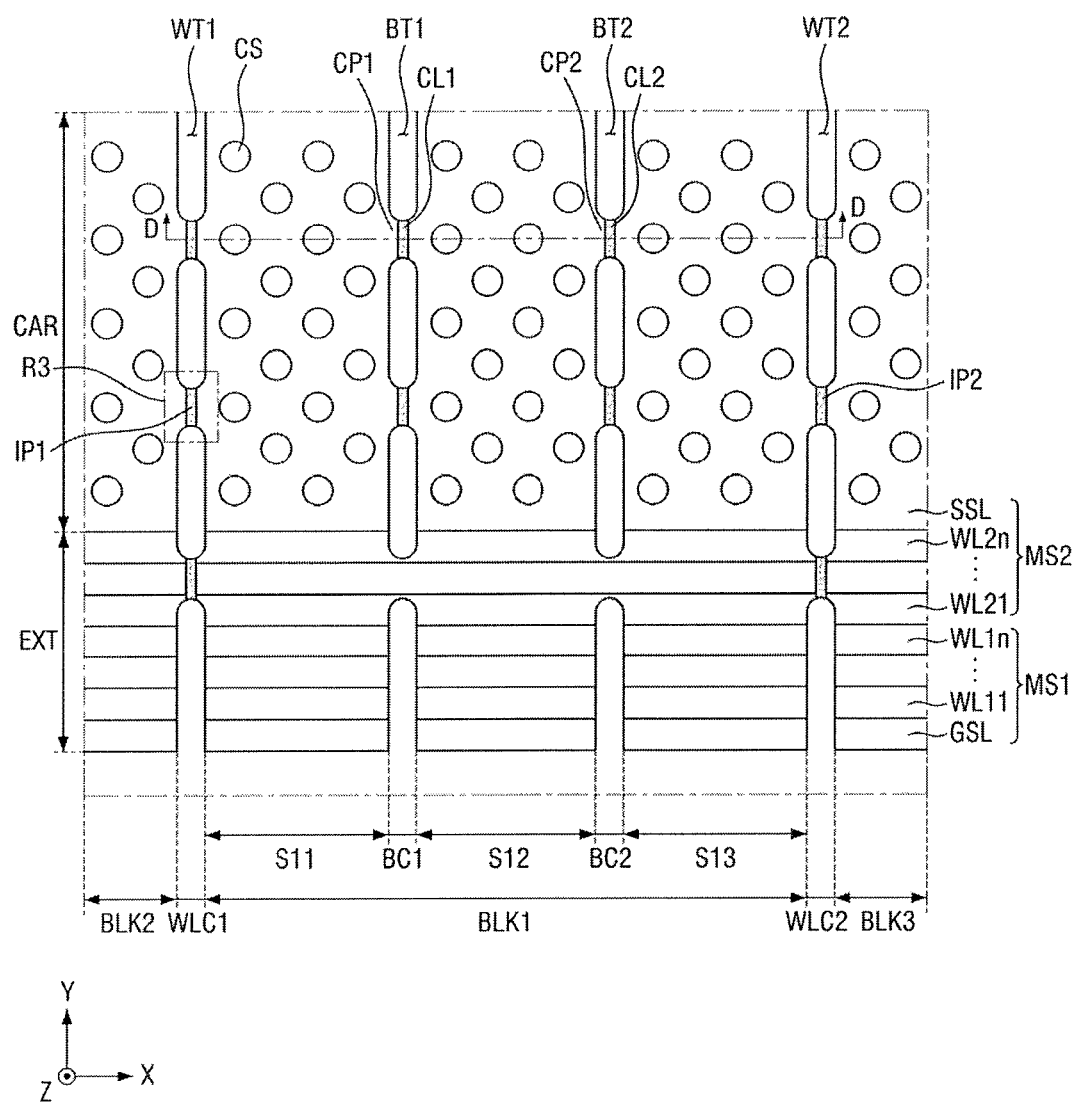
FIG. 16 is an exemplary layout diagram of the nonvolatile memory device according to some embodiments.
Figure 17:
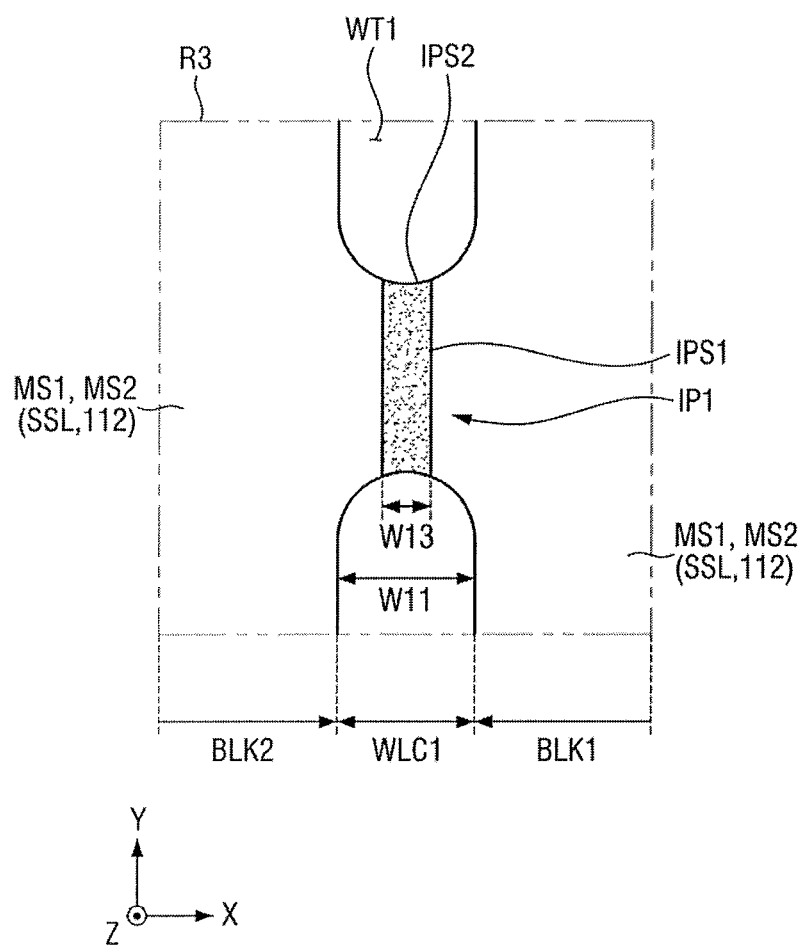
FIG. 17 is an enlarged view of a part of R4 of FIG. 16.
Figure 18:
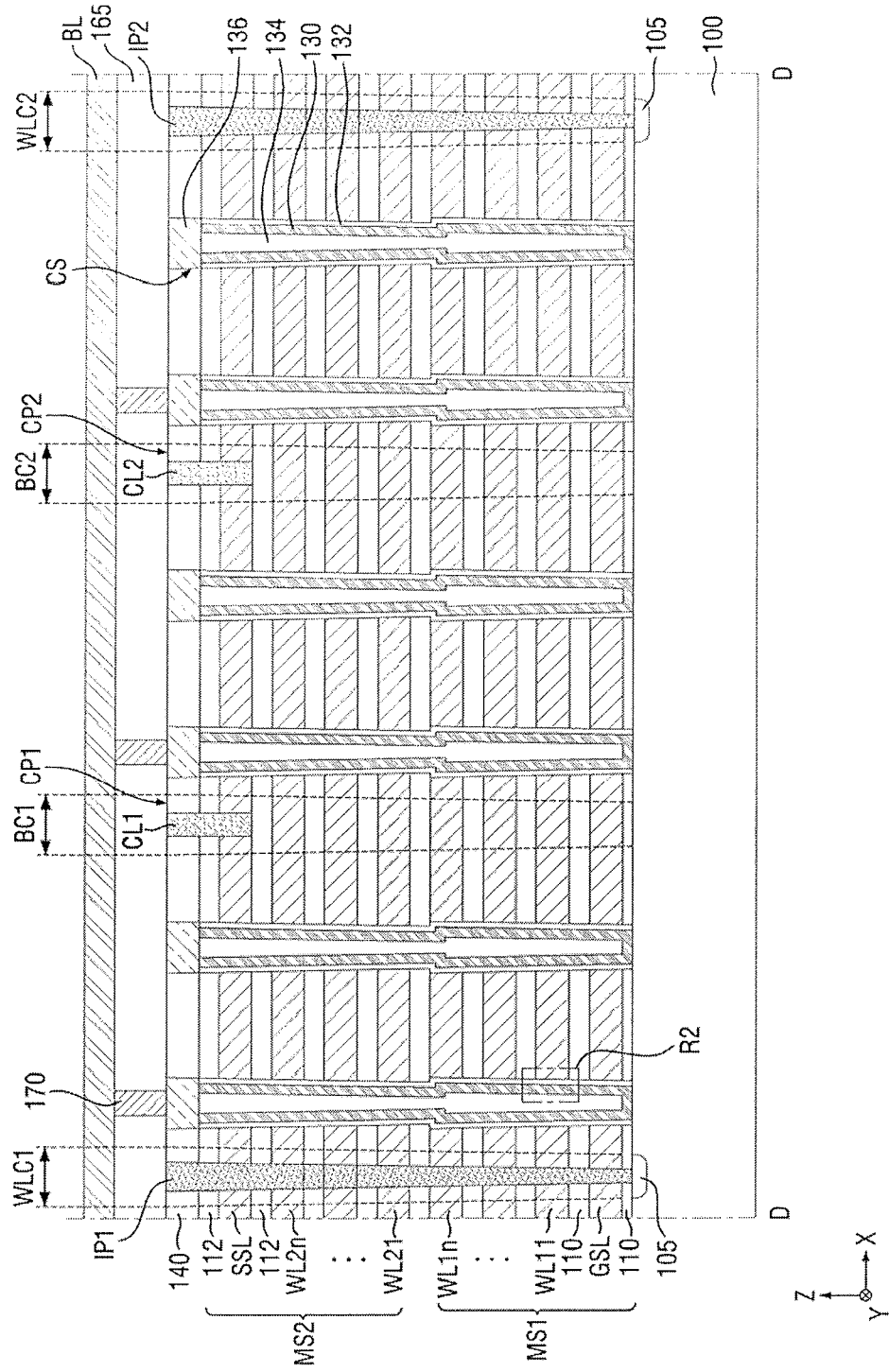
FIG. 18 is a cross-sectional view taken along lines D-D of FIG. 16.
Figure 19:
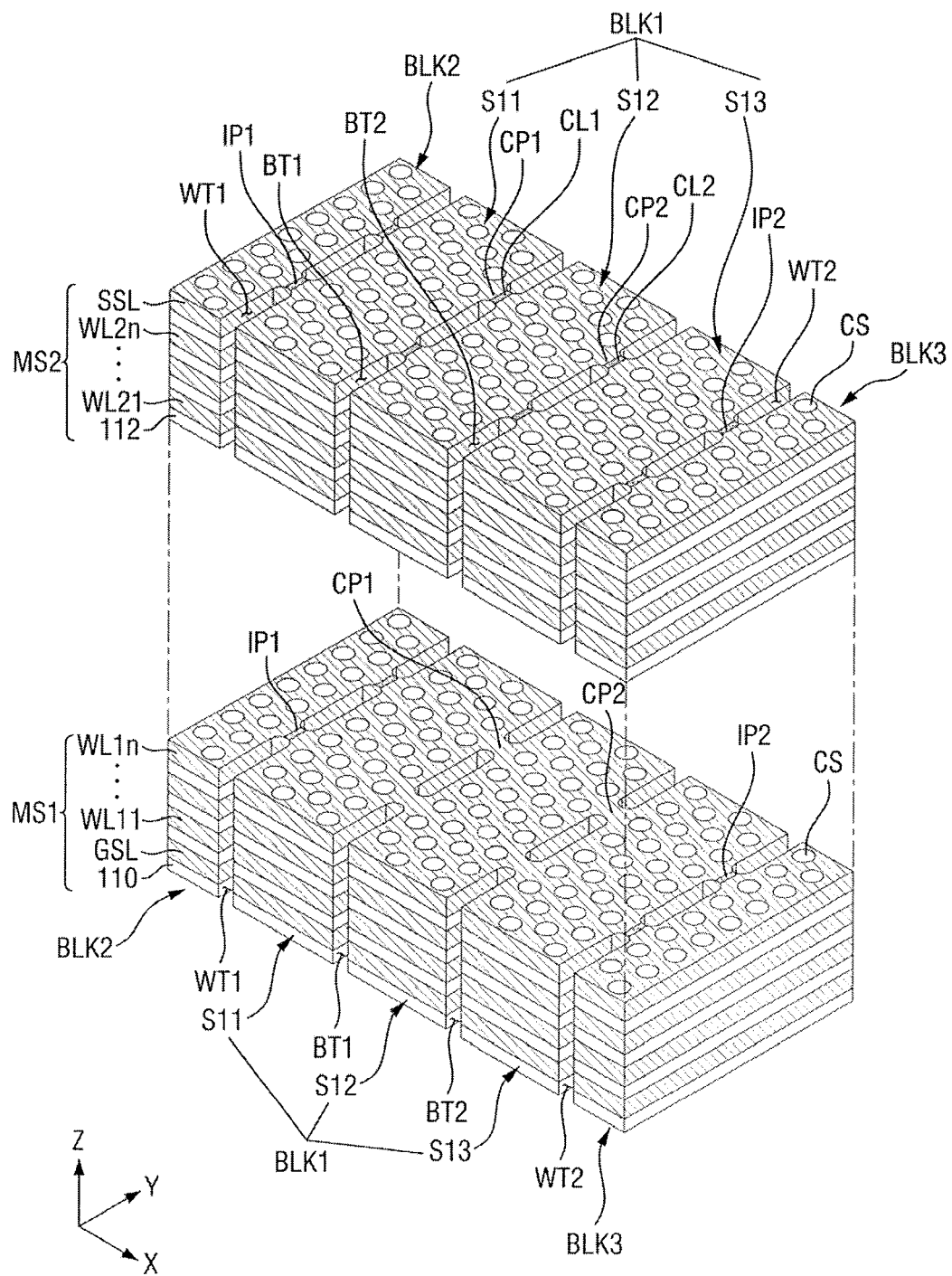
FIG. 19 is a partially exploded schematic perspective view of the nonvolatile memory device of FIGS. 16 to 18.

FIG. 16 is a layout diagram of a nonvolatile memory device according to some embodiments. FIG. 17 is an enlarged view of a part R4 of FIG. 16. FIG. 18 is a cross-sectional view taken along the line D-D of FIG. 16. FIG. 19 is a partially exploded schematic perspective view of the nonvolatile memory device of FIGS. 16 to 18. For the sake of convenience of description, repeated parts of contents explained above using FIGS. 1 to 8 may be briefly explained or omitted.

Referring to FIGS. 16 to 19, in the nonvolatile memory device according to some embodiments, the first and second insulation fillers IP1 and IP2 may linearly extend (e.g., lengthwise) along the second direction Y in plan view.

In an implementation, as shown in FIG. 17, the first side surface IPS1 of the first insulation filler IP1 may linearly extend along the second direction Y. In an implementation, the width W13 of the first insulation filler IP1 in the first direction X may be smaller than the width W11 of the first word line trench WT1.

In an implementation, the widths of the first and second insulation fillers IP1 and IP2 in the first direction X may be the same as the widths of the first and second cutting lines CL1 and CL2 in the first direction X. In an implementation, the width W13 of the first insulation filler IP1 in the first direction X may be larger or smaller than the width of the first cutting line CL1.

Hereinafter, a method of fabricating a nonvolatile memory device according to some embodiments will be described with reference to FIGS. 1 to 31. For reference, FIGS. 20 to 31 are partially exploded schematic perspective views of stages in the method of fabricating the nonvolatile memory device according to some embodiments.

FIGS. 20 to 26 are diagrams of stages in the method of fabricating the nonvolatile memory device according to some embodiments. For the sake of convenience of description, repeated parts of contents explained above using FIGS. 1 to 8 may be briefly explained or omitted.

Figure 20:
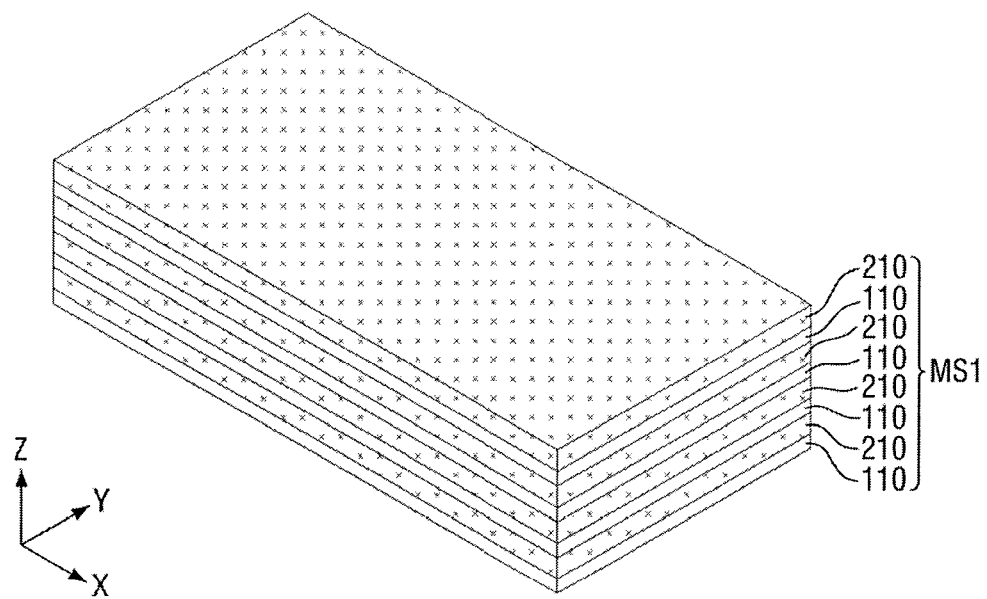
FIGS. 20 to 26 are diagrams of stages in a method of fabricating a nonvolatile memory device according to some embodiments.

Referring to FIG. 20, a first mold structure MS1 including a plurality of first sacrificial films 210 and a plurality of first mold insulation films 110 is formed.

The first sacrificial film 210 and the first mold insulation film 110 may be alternately stacked along the third direction Z. The first sacrificial film 210 may include a material having an etching selection ratio with respect to the first mold insulation film 110. In an implementation, in a case where the first mold insulation film 110 includes silicon oxide, the first sacrificial film 210 may include silicon nitride.

Figure 21:
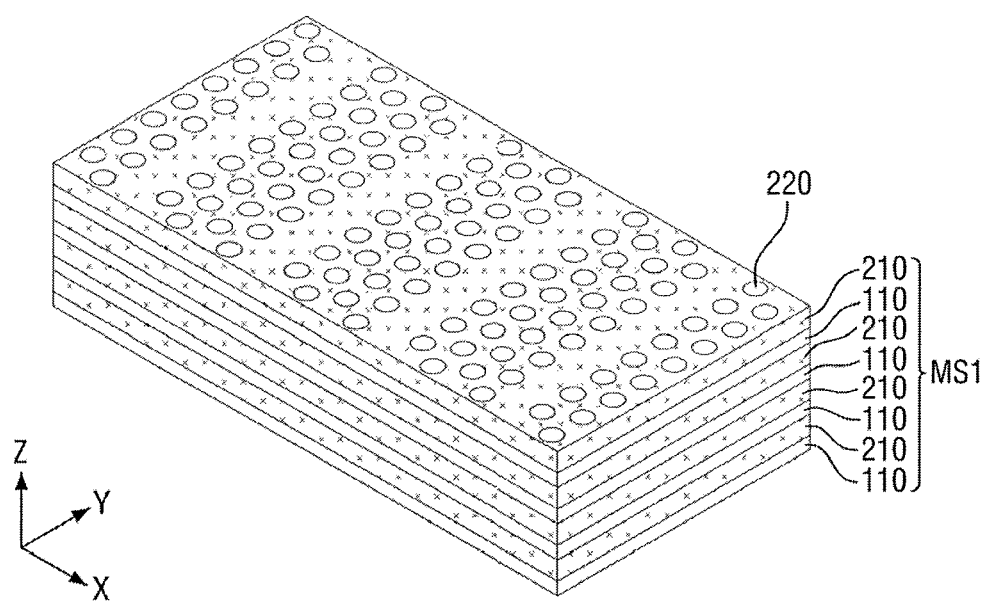

Referring to FIG. 21, a plurality of sacrificial channels 220 that penetrates the first mold structure MS1 may be formed.

In an implementation, a plurality of first penetration holes that penetrates the first mold structure MS1 and extends in the third direction Z may be formed. Next, a plurality of sacrificial channels 220 which fills each of the first penetration holes may be formed. The sacrificial channels 220 may include a material having an etching selection ratio with respect to the first sacrificial film 210 and the first mold insulation film 110. In an implementation, the sacrificial channel 220 may include polysilicon.

Figure 22:
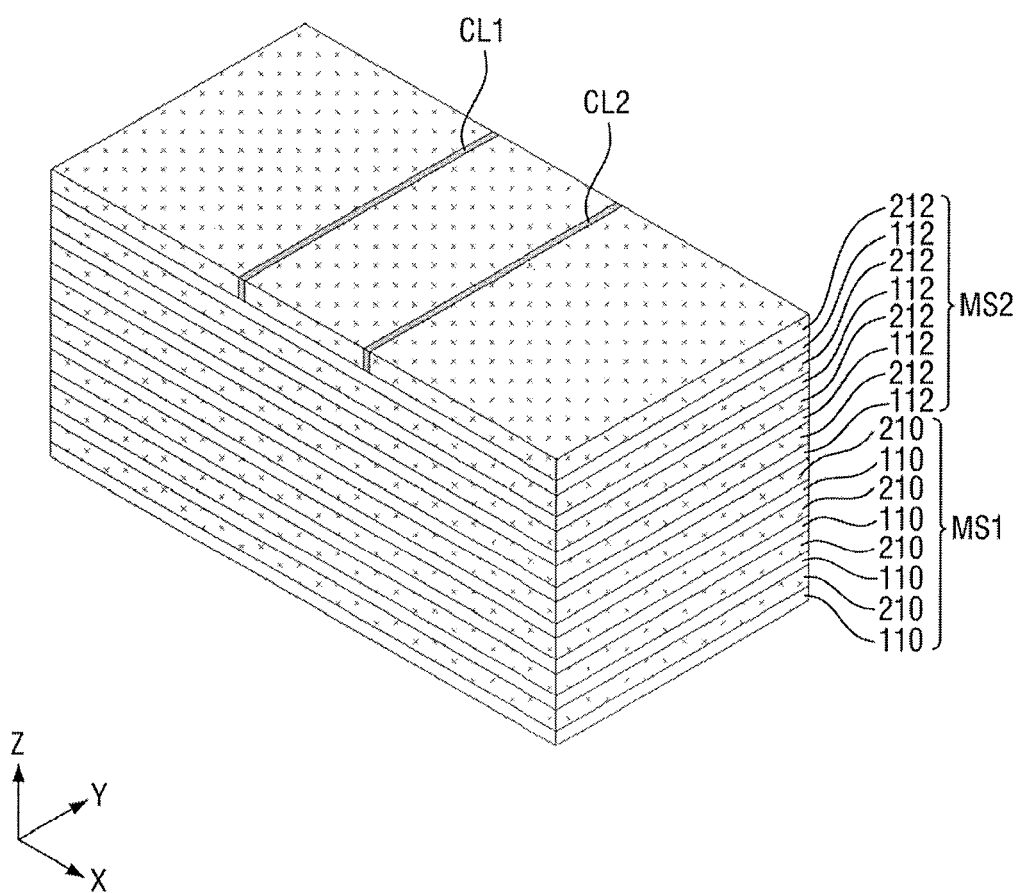

Referring to FIG. 22, a second mold structure MS2 including a plurality of second sacrificial films 212 and a plurality of second mold insulation films 112 may be formed on the first mold structure MS1.

The second sacrificial film 212 and the second mold insulation film 112 may be alternately stacked along the third direction Z. The second sacrificial film 212 may include a material having an etching selection ratio with respect to the second mold insulation film 112. In an implementation, in a case where the second mold insulation film 112 includes silicon oxide, the second sacrificial film 212 may include silicon nitride.

In an implementation, the second sacrificial film 212 may include the same material as the first sacrificial film 210, and the second mold insulation film 112 may include the same material as the first mold insulation film 110.

In an implementation, a first cutting line CL1 and a second cutting line CL2 may be further formed in the second mold structure MS2. The first cutting line CL1 and the second cutting line CL2 may be spaced apart from each other and cut at least some second sacrificial films 212 of the plurality of second sacrificial films 212. In an implementation, each of the first cutting line CL1 and the second cutting line CL2 may extend in the second direction Y and cut the uppermost second sacrificial film 212.

Figure 23:
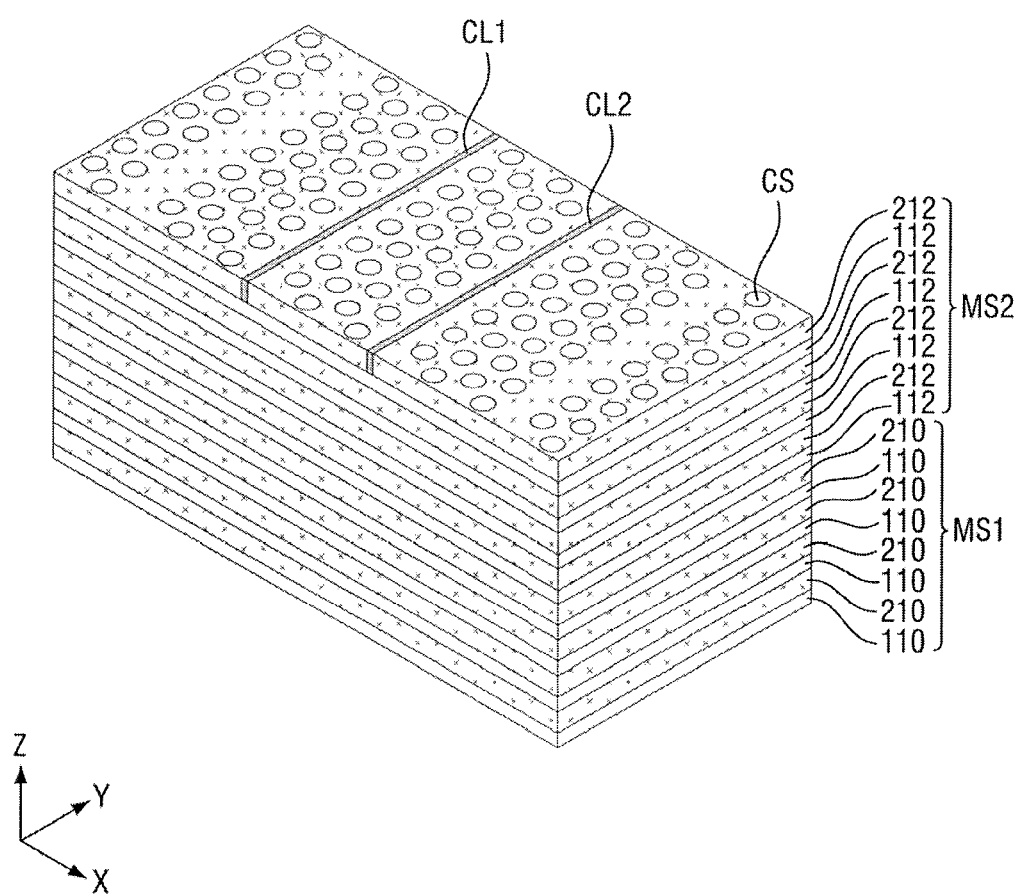

Referring to FIG. 23, a plurality of channel structures CS (that penetrates the first mold structure MS1 and the second mold structure MS2) may be formed.

In an implementation, a plurality of second penetration holes that penetrates the first mold structure MS1 and the second mold structure MS2 and extends in the third direction Z may be formed. The second penetration holes may be formed to expose the sacrificial channels (220 of FIG. 21). Next, the sacrificial channel 220 exposed by the second penetration holes may be removed, and a plurality of channel structures CS which fills the first penetration holes and the second penetration holes may be formed.

In an implementation, the first penetration holes and the second penetration may be formed separately. In an implementation, the step of forming the sacrificial channel 220 may be omitted, and the penetration holes that penetrate the first mold structure MS1 and the second mold structure MS2 at the same time may be formed.

Figure 24:
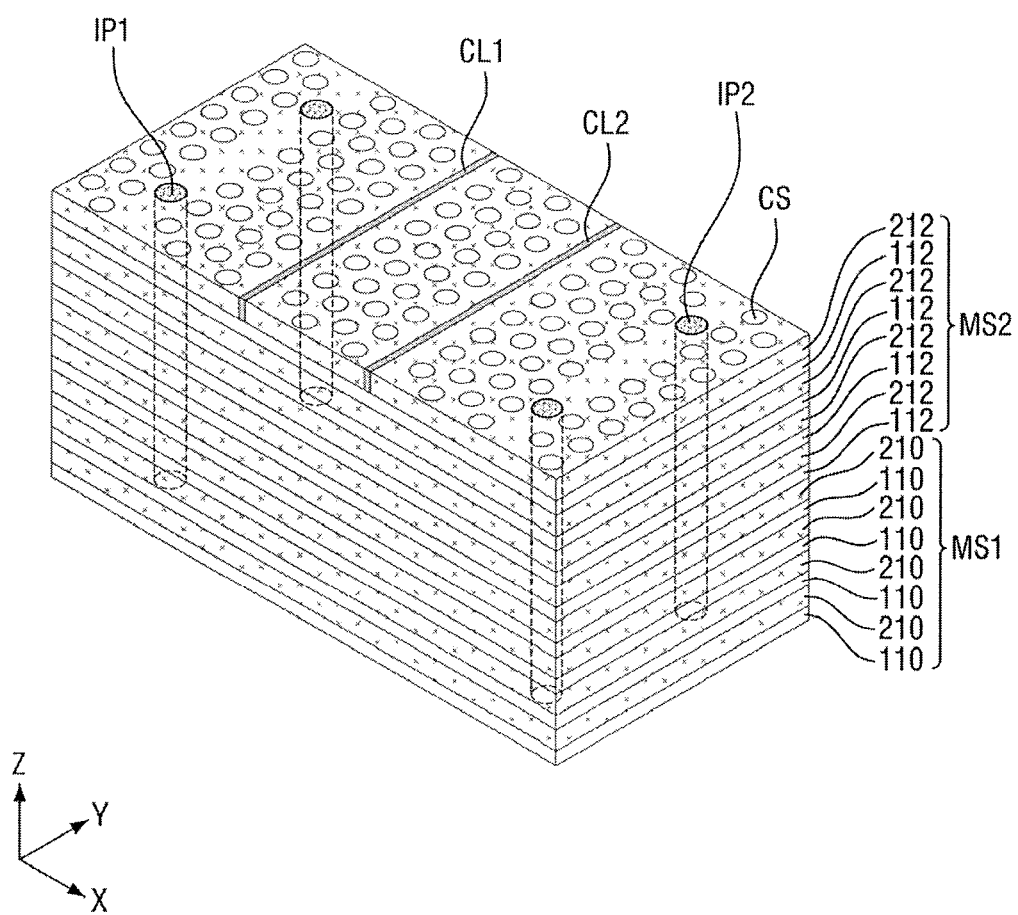

Referring to FIG. 24, a first insulation filler IP1 and a second insulation filler IP2 that penetrate the first mold structure MS1 and the second mold structure MS2 may be formed.

In an implementation, a plurality of third penetration holes that penetrates the first mold structure MS1 and the second mold structure MS2 and extends in the third direction Z may be formed. Next, a first insulation filler IP1 and a second insulation filler IP2 that fill the third penetration holes may be formed.

Therefore, the first insulation filler IP1 and the second insulation filler IP2 may form an interface with the first mold structure MS1 (or the second mold structure MS2). In an implementation, the first insulation filler IP1 may include a first side surface (IPS1 of FIG. 3) that forms an interface with the first mold structure MS1 (or the second mold structure MS2).

In an implementation, a plurality of first insulation fillers IP1 and a plurality of the second insulation fillers IP2 may be formed to be arranged along the second direction Y.

Figure 25:
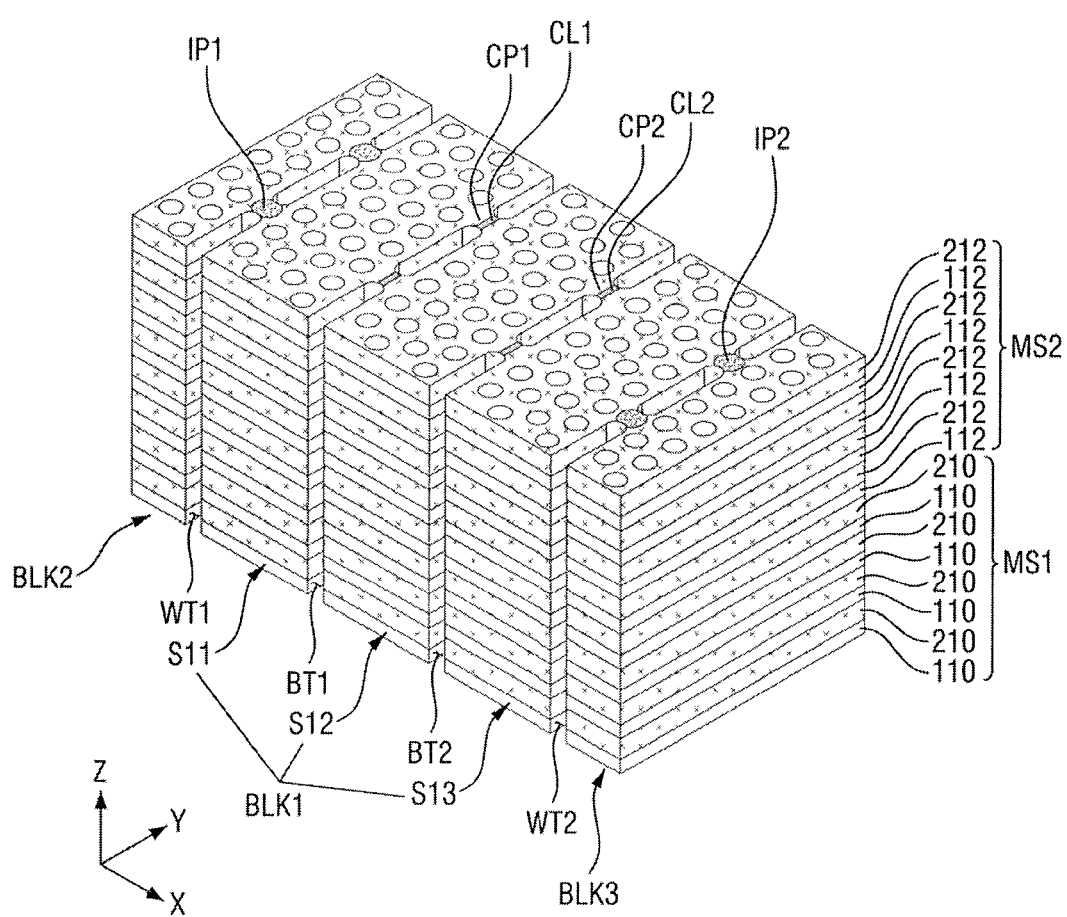

Referring to FIG. 25, a first word line trench WT1 and a second word line trench WT2 (which cut the first mold structure MS1 and the second mold structure MS2) may be formed.

The first word line trench WT1 may extend in the second direction Y and may separate the first block region BLK1 and the second block region BLK2. The first word line trench WT1 may be formed to expose the side surface of the first insulation filler IP1. Accordingly, the first word line trench WT1 and the first insulation filler IP1 may be alternately arranged along the second direction Y, and may (electrically) separate the first block region BLK1 and the second block region BLK2.

The second word line trench WT2 may extend in the second direction Y and separate the first block region BLK1 and the third block region BLK3. The second word line trench WT2 may be formed to expose the side surface of the second insulation filler IP2. As a result, the second word line trench WT2 and the second insulation filler IP2 are alternately arranged along the second direction Y, and may (electrically) separate the first block region BLK1 and the third block region BLK3.

In an implementation, the first word line trench WT1 (or the second word line trench WT2) may be formed to overlap at least a part of the first insulation filler IP1 (or the second insulation filler IP2) in plan view. In an implementation, the first insulation filler IP1 (or the second insulation filler IP2) may form an interface with the first word line trench WT1 (or the second word line trench WT2). In an implementation, the first insulation filler IP1 may include a second side surface (IPS2 of FIG. 3) that forms an interface with the first word line trench WT1.

In an implementation, a first block trench BT1 that extends in the second direction Y and separates the first stack S11 and the second stack S12 may be further formed. In an implementation, the first block trench BT1 and the first stack connection CP1 may be alternately arranged along the second direction Y, and may separate the first stack S11 and the second stack S12. In an implementation, the first block trench BT1 may be formed to overlap the first cutting line CL1. In an implementation, the first cutting line CL1 may be formed in the first stack connection CP1.

In an implementation, a second block trench BT2 that extends in the second direction Y and separates the second stack S12 and the third stack S13 may be further formed. In an implementation, the second block trench BT2 and the second stack connection CP2 may be alternately arranged along the second direction Y, and may be separate the second stack S12 and the third stack S13. In an implementation, the second block trench BT2 may be formed to overlap the second cutting line CL2. In an implementation, the second cutting line CL2 may be formed in the second stack connection CP2.

Figure 26:
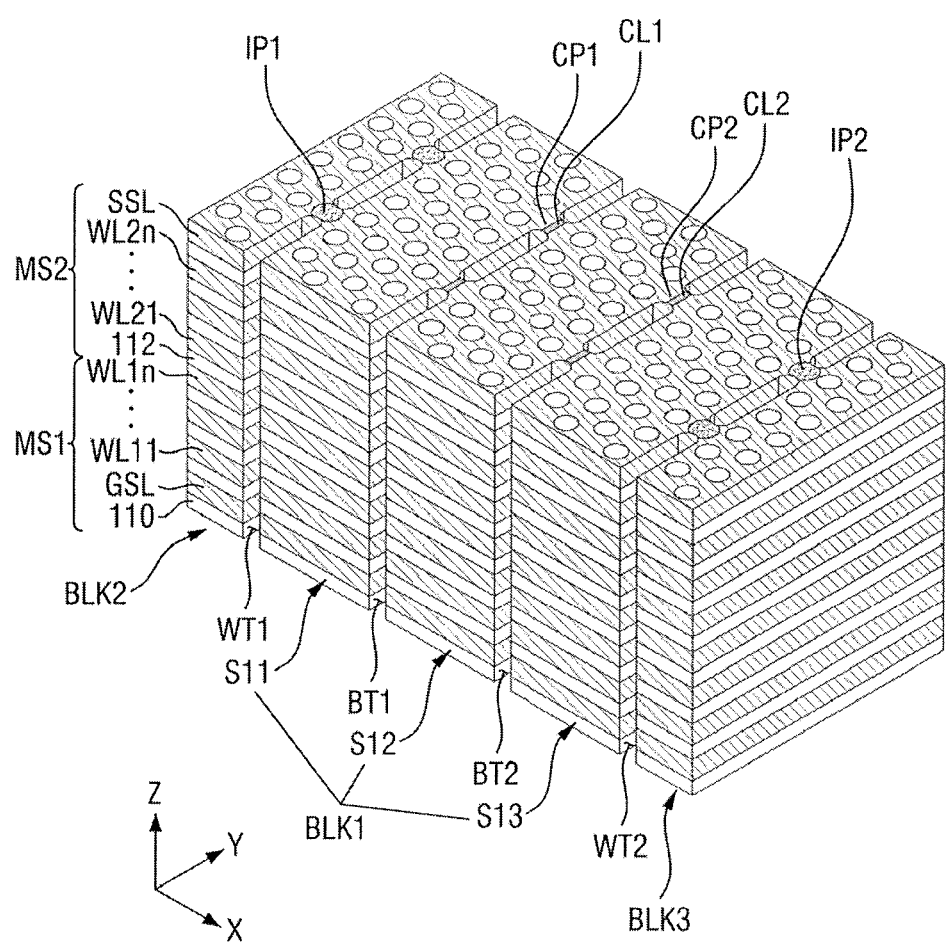

Referring to FIG. 26, a plurality of first gate electrodes GSL and WL11 to WL1$n$ and a plurality of second gate electrodes WL21 to WL2$n$ and SSL may be formed.

The plurality of first gate electrodes GSL and WL11 to WL1$n$ may be formed in a region in which the plurality of first sacrificial films 210 have been removed. In an implementation, the plurality of first sacrificial films 210 may be replaced with the plurality of first gate electrodes GSL and WL11 to WL1$n$. The plurality of second gate electrodes WL21 to WL2$n$ and SSL may be formed in a region in which the plurality of second sacrificial films 212 have been removed. In an implementation, the plurality of second sacrificial films 212 may be replaced with the plurality of second gate electrodes WL21 to WL2$n$ and SSL.

Accordingly, the nonvolatile memory device described above using FIGS. 2 to 8 may be fabricated. In an implementation, the etching process for forming the third penetration hole may further etch the first sacrificial film 210 and the second sacrificial film 212 as compared to the first mold insulation film 110 and the second mold insulation film 112. In such a case, the nonvolatile memory device described above using FIG. 9 may be fabricated.

Figure 27:
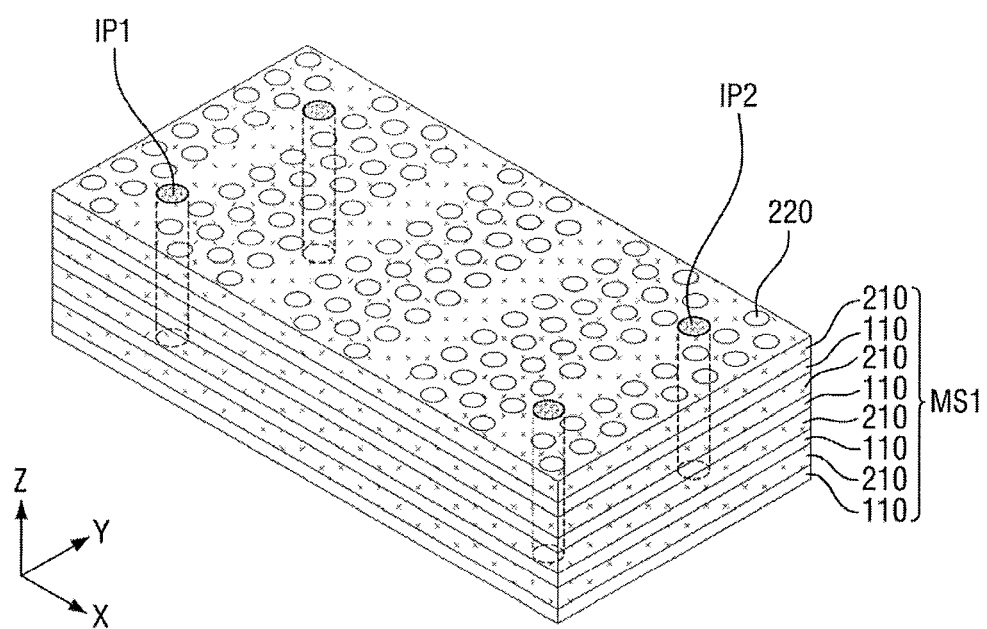
FIG. 27 is a diagram of a stage in a method of fabricating the nonvolatile memory device according to some embodiments.

FIG. 27 is a diagram of a stage in the method of fabricating the nonvolatile memory device according to some embodiments. For convenience of explanation, repeated parts of contents explained above using FIGS. 1 to 26 may be briefly explained or omitted. For reference, FIG. 27 is a diagram of the stage subsequent to FIG. 21.

Referring to FIG. 27, a first insulation filler IP1 and a second insulation filler IP2 that penetrate the first mold structure MS1 may be formed.

In an implementation, a plurality of fourth penetration holes that penetrates the first mold structure MS1 and extends in the third direction Z may be formed. Next, a first insulation filler IP1 and a second insulation filler IP2 that fill the fourth penetration hole may be formed.

Next, the stages described above using FIGS. 22 to 26 may be performed. Accordingly, the nonvolatile memory device described above using FIG. 10 may be fabricated.

Figure 28:
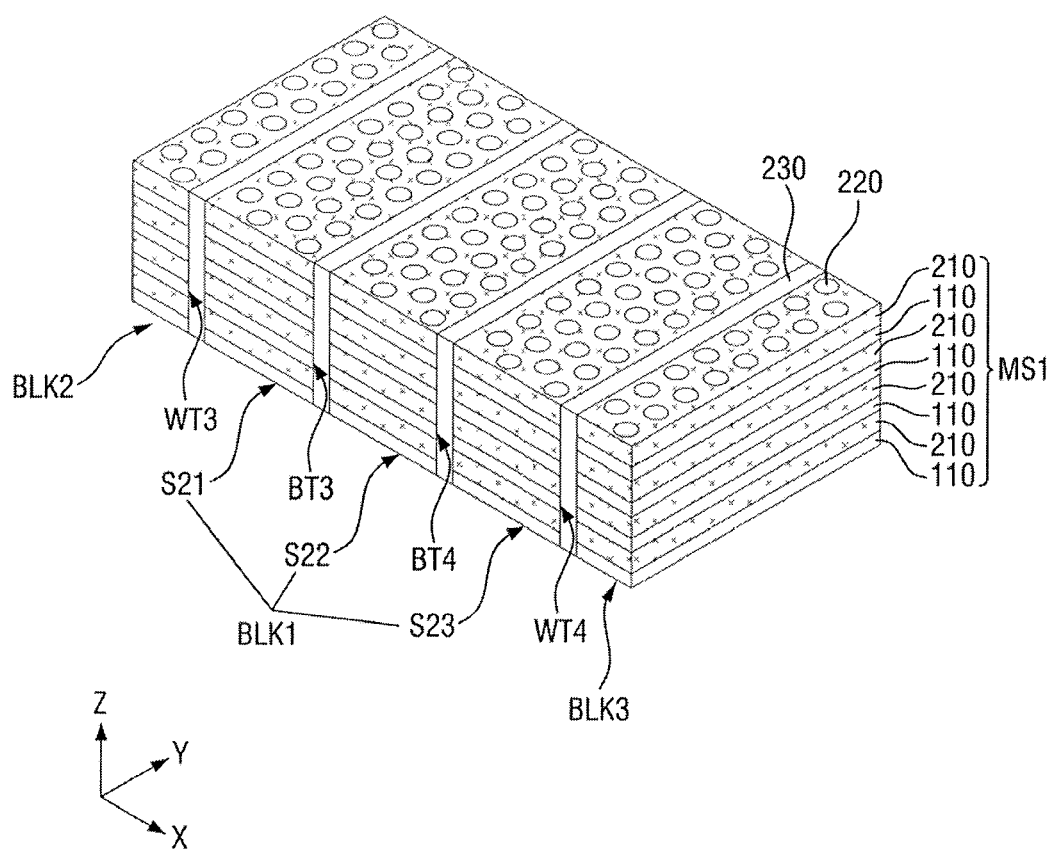
FIGS. 28 to 29 are diagrams of stages in a method of fabricating the nonvolatile memory device according to some embodiments.
Figure 29:
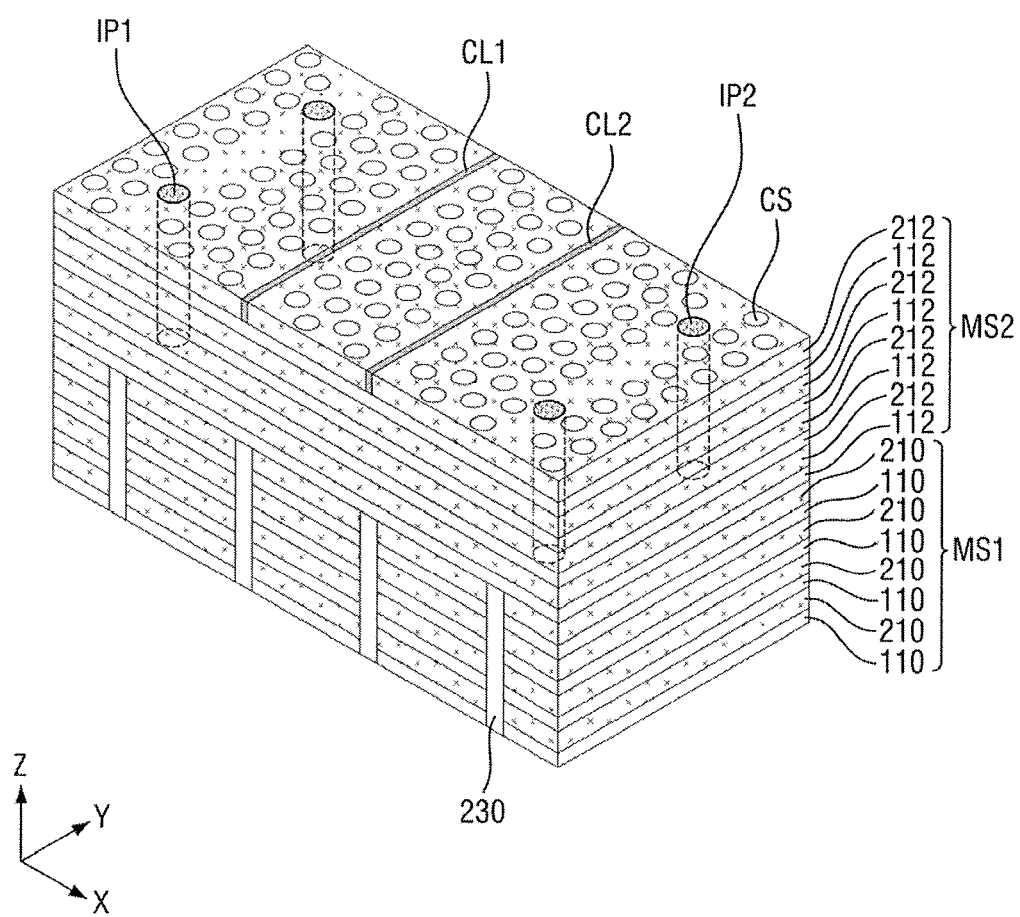

FIGS. 28 and 29 are diagrams of stages in the method of fabricating the nonvolatile memory device according to some embodiments. For convenience of explanation, repeated parts of contents explained above using FIGS. 1 to 26 may be briefly explained or omitted. For reference, FIG. 28 is a diagram of the stage subsequent to FIG. 21.

Referring to FIG. 28, a third word line trench WT3 and a fourth word line trench WT4 are formed in the first mold structure MS1.

The third word line trench WT3 may extend in the second direction Y and separate the first block region BLK1 and the second block region BLK2. The fourth word line trench WT4 may extend in the second direction Y and separate the first block region BLK1 and the third block region BLK3. In an implementation, the third word line trench WT3 and the fourth word line trench WT4 may extend lengthwise in the second direction Y and may completely cut the first mold structure MS1. Next, a filling film 230 which fills the third word line trench WT3 and the fourth word line trench WT4 may be formed.

In an implementation, a third block trench BT3 and a fourth block trench BT4 may be further formed in the first mold structure MS1. The third block trench BT3 may extend in the second direction Y and separate the fourth stack S21 and the fifth stack S22. The fourth block trench BT4 may extend in the second direction Y and separate the fifth stack S22 and the sixth stack S23. In an implementation, the third block trench BT3 and the fourth block trench BT4 may extend lengthwise in the second direction Y and completely cut the first mold structure MS1. Next, a filling film 230 that fills the third block trench BT3 and the fourth block trench BT4 may be formed.

Subsequently, the stages described above using FIGS. 22 and 23 may be performed.

Referring to FIG. 29, a first insulation filler IP1 and a second insulation filler IP2 that penetrate the second mold structure MS2 are formed.

In an implementation, the first insulation filler IP1 and the second insulation filler IP2 may be formed on the filling film 230. In an implementation, the first insulation filler IP1 and the second insulation filler IP2 may not penetrate the first mold structure MS1.

Subsequently, the stages described above using FIGS. 25 and 26 may be performed. In an implementation, the filling film 230 may be removed and replaced with a filling insulation film (150 of FIG. 11). Accordingly, the nonvolatile memory device described above using FIG. 11 may be fabricated.

Figure 30:
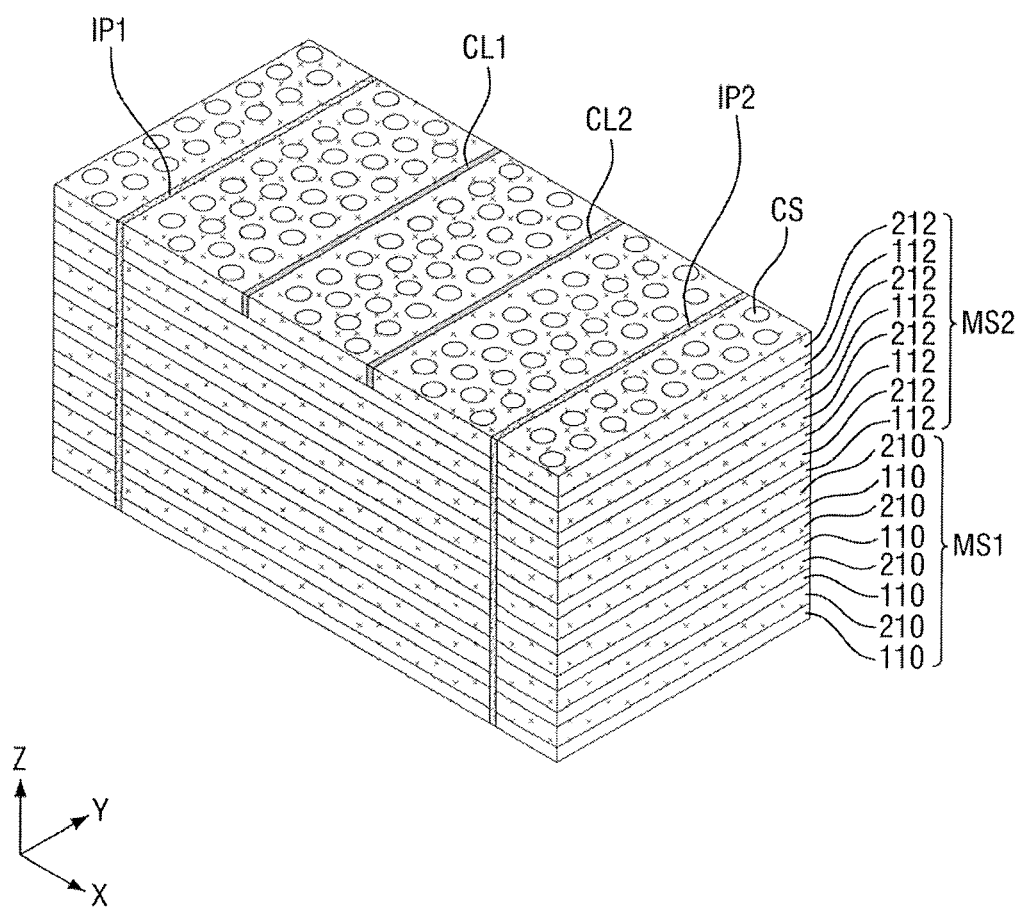
FIGS. 30 to 31 are diagrams of stages in a method of fabricating the nonvolatile memory device according to some embodiments.
Figure 31:
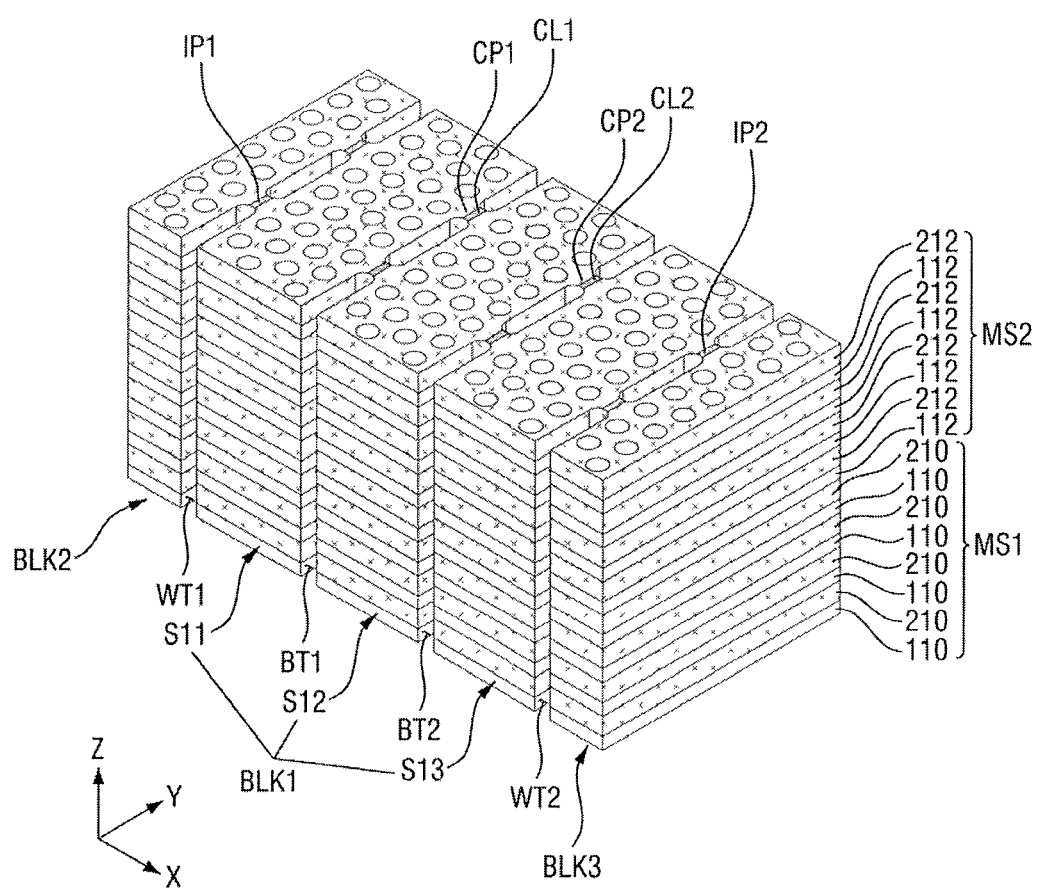

FIGS. 30 and 31 are diagrams of stages in the method of fabricating the nonvolatile memory device according to some embodiments. For convenience of explanation, repeated parts of contents explained above using FIGS. 1 to 26 may be briefly explained or omitted. For reference, FIG. 30 is a diagram of the stage subsequent to FIG. 23.

Referring to FIG. 30, a first insulation filler IP1 and a second insulation filler IP2 (which cut the first mold structure MS1 and the second mold structure MS2) may be formed.

In an implementation, the first insulation filler IP1 and the second insulation filler IP2 may be spaced apart from each other and may cut the first mold structure MS1 and the second mold structure MS2. In an implementation, each of the first insulation filler IP1 and the second insulation filler IP2 may extend in the second direction Y, and completely cut the first mold structure MS1 and the second mold structure MS2.

Referring to FIG. 31, a first word line trench WT1 and a second word line trench WT2 that cut the first mold structure MS1 and the second mold structure MS2 may be formed. In an implementation, the first block trench BT1 and the second block trench BT2 may be further formed.

Formation of the first word line trench WT1, the second word line trench WT2, the first block trench BT1, and the second block trench BT2 is similar to that described above using FIG. 25, and a repeated detailed description thereof may not be provided.

Subsequently, the stage described above using FIG. 26 may be performed. As a result, the nonvolatile memory device described above using FIGS. 16 to 19 may be fabricated.

By way of summation and review, the degree of integration of the nonvolatile memory device may be increased to satisfy excellent performance and low cost desired by consumers. In the case of a two-dimensional or planar memory device, the degree of integration may be determined by an area occupied by unit memory cells. A three-dimensional memory device in which unit memory cells are vertically disposed has been considered.

One or more embodiments may provide a nonvolatile memory device including a word line cutting region.

One or more embodiments may provide a nonvolatile memory device having improved product reliability.

One or more embodiments may provide a method of fabricating a nonvolatile memory device having improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
   a substrate;
   a first mold structure on the substrate, the first mold structure including a plurality of first mold insulation films and a plurality of first gate electrodes, which are alternately stacked;
   a channel structure that penetrates the first mold structure and intersects the plurality of first gate electrodes; and
   at least one insulation filler that intersects the plurality of first mold insulation films and the plurality of the first gate electrodes,
   wherein:
   the first mold structure is electrically separated by a word line cutting region extending in a first direction such that the first mold structure includes a first block region and a second block region, and
   the at least one insulation filler is in the word line cutting region and connects the first block region and the second block region.

2. The nonvolatile memory device as claimed in claim 1, further comprising a word line trench in the word line cutting region, the word line trench extending in the first direction to separate the first block region and the second block region, wherein the at least one insulation filler includes a first side surface facing each of the first mold insulation films and a second side surface facing the word line trench.

3. The nonvolatile memory device as claimed in claim 2, wherein, in a plan view,
   the first side surface is convex toward each of the first mold insulation films, and
   the second side surface is concave toward the word line trench.

4. The nonvolatile memory device as claimed in claim 2, wherein, in a plan view, the first side surface extends linearly along the first direction.

5. The nonvolatile memory device as claimed in claim 1, wherein the at least one insulation filler includes a plurality of insulation fillers arranged along the first direction.

6. The nonvolatile memory device as claimed in claim 1, further comprising a second mold structure between the substrate and the first mold structure, the second mold structure including a plurality of second mold insulation films and a plurality of second gate electrodes that are alternately stacked, wherein:
   the second mold structure is electrically separated by the word line cutting region to be a part of the first block region and the second block region, and
   the at least one insulation filler further intersects the plurality of second mold insulation films and the plurality of second gate electrodes.

7. The nonvolatile memory device as claimed in claim 6, wherein:
   the at least one insulation filler includes an upper filler in the first mold structure and a lower filler in the second mold structure,
   a width of an uppermost part of the lower filler in the first direction is larger than a width of a lowermost part of the upper filler in the first direction.

8. The nonvolatile memory device as claimed in claim 1, further comprising:
   a second mold structure between the substrate and the first mold structure, the second mold structure including a plurality of second mold insulation films and a plurality of second gate electrodes that are alternately stacked; and
   a filling insulation film in the word line cutting region, the filling insulation film extending in the first direction to electrically separate the second mold structure,
   wherein the at least one insulation filler is on the filling insulation film.

9. The nonvolatile memory device as claimed in claim 1, wherein:
   the first block region includes a first stack, a second stack spaced apart from the first stack by a block cutting region extending in the first direction, and a stack connection between the first stack the second stack and connecting the first stack and the second stack, and
   each of the first stack, the second stack, and the stack connection includes the plurality of first mold insulation films and the plurality of first gate electrodes that are alternately stacked.

10. The nonvolatile memory device as claimed in claim 1, wherein the first mold insulation film and the at least one insulation filler include insulating materials that are different from each other.

11. A nonvolatile memory device, comprising:
    a substrate;
    a mold structure including a first block region and a second block region spaced apart from each other, the mold structure including a plurality of gate electrodes stacked on the substrate;
    a plurality of channel structures penetrating the mold structure and intersecting the plurality of gate electrodes;
    a bit line extending in a first direction and connected to the respective channel structures;
    a word line trench extending in a second direction intersecting the first direction to separate the first block region and the second block region; and
    an insulation filler between the first block region and the second block region, the insulation filler extending in a third direction intersecting an upper surface of the substrate to connect the first block region and the second block region,
    wherein the first block region includes a first stack and a second stack spaced apart from each other, a block trench extending in the second direction to separate the first stack and the second stack, and a stack connection between the first stack and the second stack for connecting the first stack and the second stack.

12. The nonvolatile memory device as claimed in claim 11, wherein each of the first stack, the second stack, and the stack connection includes the plurality of gate electrodes that are alternately stacked.

13. The nonvolatile memory device as claimed in claim 12, further comprising a cutting line extending in the second direction inside the stack connection,
    wherein the cutting line cuts a string selection line at an uppermost part of the plurality of gate electrodes.

14. The nonvolatile memory device as claimed in claim 11, wherein:
    the word line trench and the insulation filler are alternately arranged along the second direction, and
    the block trench and the stack connection are arranged alternately along the second direction.

15. The nonvolatile memory device as claimed in claim 11, wherein the first block region and the second block region are electrically separated from each other by the word line trench and the insulation filler.

16. The nonvolatile memory device as claimed in claim 11, further comprising a filling insulation film that fills the word line trench and the block trench.

17. The nonvolatile memory device as claimed in claim 11, wherein the insulation filler includes:
   a filler part extending in the third direction and penetrating the mold structure, and
   a plurality of protrusions protruding from side surfaces of the filler part toward the respective gate electrodes.

\* \* \* \* \*